United States Patent
Watanabe et al.

(10) Patent No.: US 7,119,439 B2
(45) Date of Patent: Oct. 10, 2006

(54) SEMICONDUCTOR DEVICE AND METHOD FOR MANUFACTURING THE SAME

(75) Inventors: Kenichi Watanabe, Kawasaki (JP); Michiari Kawano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/454,667

(22) Filed: Jun. 5, 2003

(65) Prior Publication Data

US 2003/0227089 A1    Dec. 11, 2003

(30) Foreign Application Priority Data

Jun. 6, 2002    (JP) .............................. 2002-165818
Mar. 20, 2003    (JP) .............................. 2003-076962

(51) Int. Cl.
*H01L 21/302*    (2006.01)
*H01L 21/461*    (2006.01)

(52) U.S. Cl. ...................... 257/751; 257/753; 257/758; 257/760; 257/762; 257/773; 257/774; 257/529; 438/627; 438/637; 438/638; 438/666; 438/687

(58) Field of Classification Search ............... 257/529, 257/758, 773–774, 776, 751, 753, 760, 762; 438/627, 637–638, 666, 687
See application file for complete search history.

(56) References Cited

U.S. PATENT DOCUMENTS

| 6,362,524 | B1* | 3/2002 | Blish et al. ................. 257/734 |
| 6,498,089 | B1* | 12/2002 | Komada ..................... 438/618 |
| 6,582,976 | B1* | 6/2003 | Watanabe .................... 438/14 |
| 6,734,090 | B1* | 5/2004 | Agarwala et al. ........... 438/598 |
| 2002/0125577 | A1* | 9/2002 | Komada ..................... 257/774 |
| 2003/0001267 | A1* | 1/2003 | Watanabe ................... 257/758 |
| 2003/0015802 | A1* | 1/2003 | Watanabe ................... 257/774 |
| 2003/0067079 | A1* | 4/2003 | Ishikawa et al. ............ 257/774 |
| 2003/0102565 | A1* | 6/2003 | Ishikawa et al. ............ 257/774 |
| 2003/0157794 | A1* | 8/2003 | Agarwala et al. ........... 438/627 |
| 2003/0164532 | A1* | 9/2003 | Liu et al. .................... 257/529 |
| 2003/0173675 | A1* | 9/2003 | Watanabe et al. ........... 257/758 |
| 2004/0026785 | A1* | 2/2004 | Tomita ........................ 257/758 |
| 2004/0087078 | A1* | 5/2004 | Agarwala et al. ........... 438/200 |

FOREIGN PATENT DOCUMENTS

JP    2000-208525    7/2000

(Continued)

OTHER PUBLICATIONS

Taiwanese Office Action, Application No. 092115253, dated Jun. 9, 2004.

(Continued)

*Primary Examiner*—Lynne A. Gurley
(74) *Attorney, Agent, or Firm*—Arent Fox PLLC

(57) ABSTRACT

After formation of a contact pattern on a semiconductor substrate, a first wiring pattern composed of a first barrier metal film and a first conductor pattern is formed on the contact pattern. A moisture-proof ring is formed which has such a structure that an outer peripheral portion, covering a sidewall face on the outer peripheral side of the first conductor pattern, of the first barrier metal film, is in contact at the upper end portion with a barrier metal bottom face portion, covering the bottom face of a via contact portion, of a second barrier metal film. This results in formation of a barrier metal film such as Ta, TiN, or the like, with no discontinuation, in the whole region from the semiconductor substrate to an silicon oxide film being the uppermost layer, thereby improving adhesiveness for prevention of cracks and entry of moisture.

26 Claims, 30 Drawing Sheets

FOREIGN PATENT DOCUMENTS

| | | |
|---|---|---|
| JP | 2001-036066 | 2/2001 |
| JP | 2001-53148 A | 2/2001 |
| JP | 2002-50690 A | 2/2002 |
| JP | 2002-76114 A | 3/2002 |

OTHER PUBLICATIONS

Office Action issued Feb. 4, 2005 in corresponding Chinese Application No. 03142424.4.

* cited by examiner

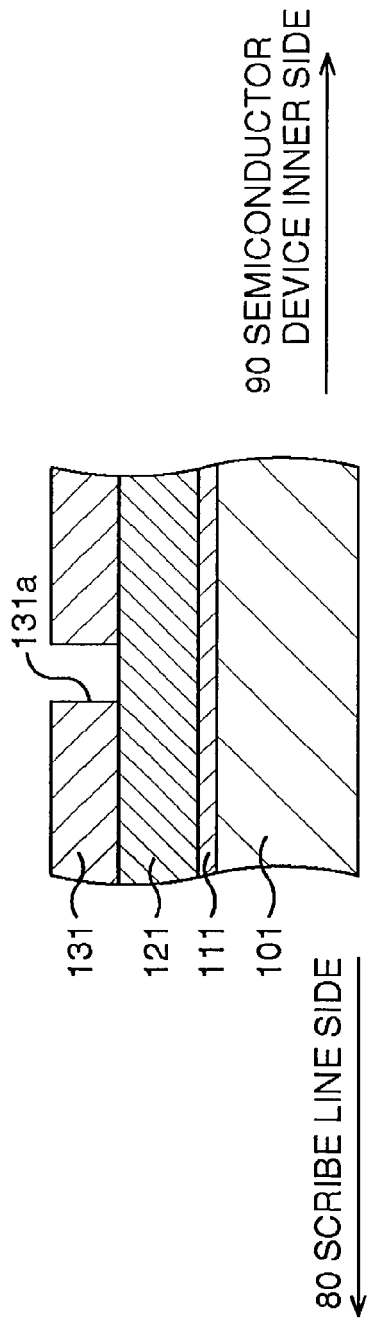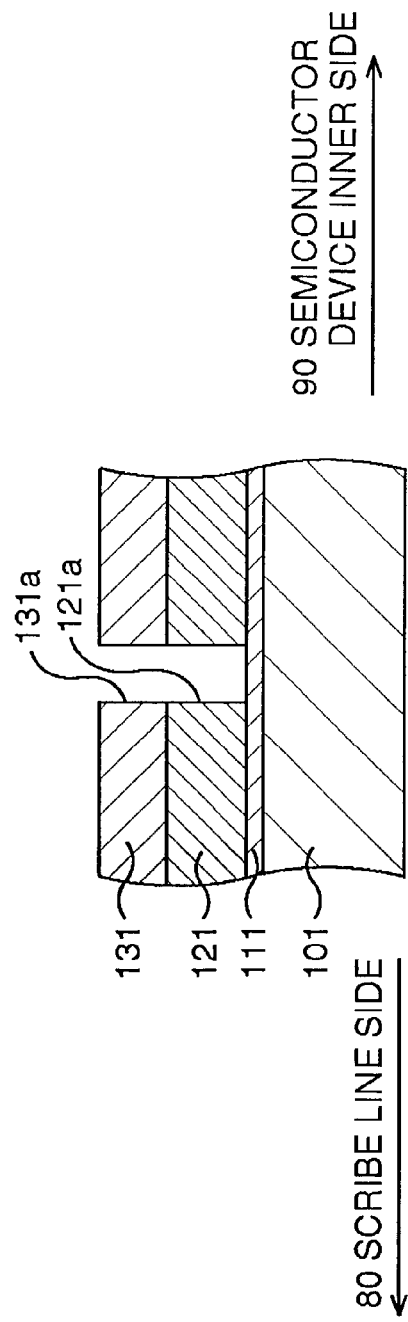

← 80 SCRIBE LINE SIDE

90 SEMICONDUCTOR DEVICE INNER SIDE →

← 80 SCRIBE LINE SIDE

90 SEMICONDUCTOR DEVICE INNER SIDE →

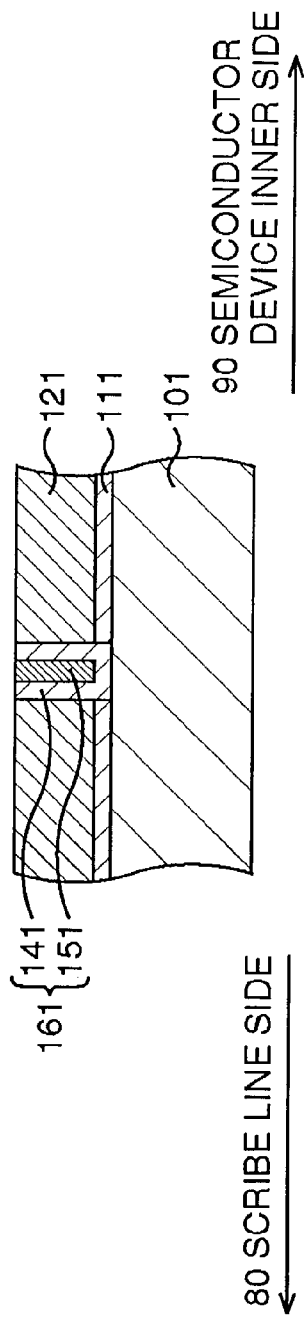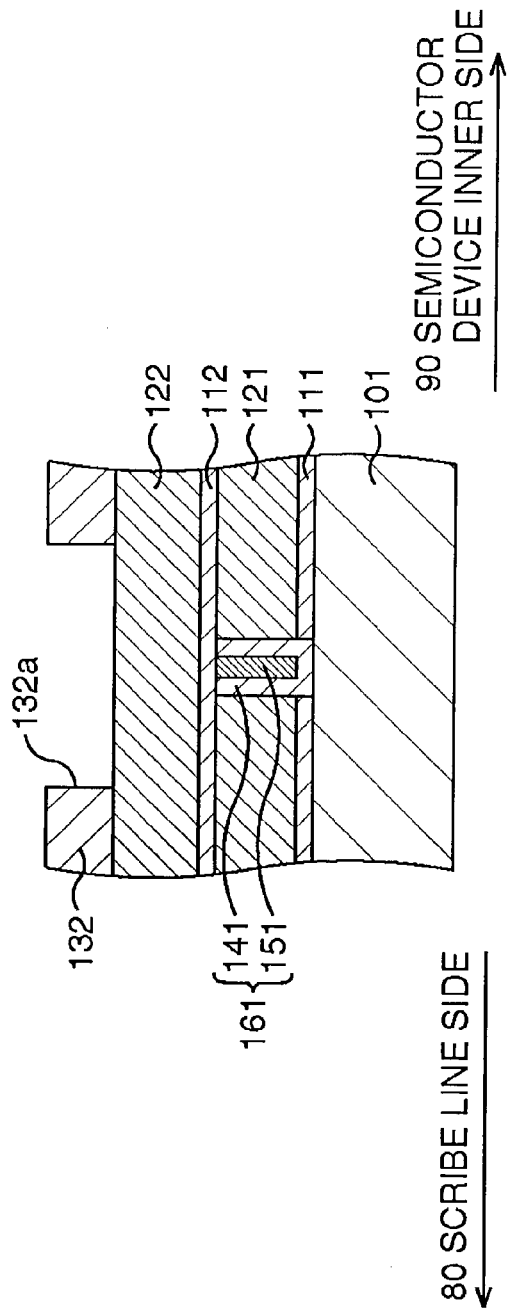

← 80 SCRIBE LINE SIDE    90 SEMICONDUCTOR DEVICE INNER SIDE →

← 80 SCRIBE LINE SIDE    90 SEMICONDUCTOR DEVICE INNER SIDE →

← 80 SCRIBE LINE SIDE

90 SEMICONDUCTOR DEVICE INNER SIDE →

← 80 SCRIBE LINE SIDE

90 SEMICONDUCTOR DEVICE INNER SIDE →

80 SCRIBE LINE SIDE

90 SEMICONDUCTOR DEVICE INNER SIDE

80 SCRIBE LINE SIDE

90 SEMICONDUCTOR DEVICE INNER SIDE

80 SCRIBE LINE SIDE ←→    90 SEMICONDUCTOR DEVICE INNER SIDE →

80 SCRIBE LINE SIDE ←→    90 SEMICONDUCTOR DEVICE INNER SIDE →

80 SCRIBE LINE SIDE ← → 90 SEMICONDUCTOR DEVICE INNER SIDE

80 SCRIBE LINE SIDE ← → 90 SEMICONDUCTOR DEVICE INNER SIDE

80 SCRIBE LINE SIDE

90 SEMICONDUCTOR DEVICE INNER SIDE

80 SCRIBE LINE SIDE ← → 90 SEMICONDUCTOR DEVICE INNER SIDE

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application Nos. 2002-165818, filed on Jun. 6, 2002 and 2003-076962, filed on Mar. 20, 2003, the entire contents of which are incorporated herein by reference.

BACKGROUND OF THE INVENTION

1. Field of the Invention

The present invention generally relates to a semiconductor device and a method for manufacturing the same and, more specifically, to a semiconductor device with a moisture-proof ring and a method for manufacturing the same.

2. Description of the Related Art

In semiconductor devices in recent years, with miniaturization and high integration, a multilayer wiring structure, in which a plurality of interlayer insulation films are layered in each of which a wiring pattern is embedded, is often used to connect many semiconductor elements to each other on a common substrate. In such a semiconductor device, moisture or corrosive gas may enter the inside of the semiconductor device along the interface between the interlayer insulation films constituting the multilayer wiring structure, and thus it is generally performed to form in the multilayer wiring structure a moisture-proof ring along the peripheral portion of the substrate to intercept entry of moisture or corrosive gas.

In semiconductor devices in recent years, with miniaturization and high integration, the design rule becomes smaller every year, giving rise to a technical limit in a method of forming a metal wiring material by direct etching. Hence, a start has already been made at using a damascene method which forms in an interlayer insulation film a wiring pattern and a via contact, or both a wiring pattern and a via contact by a photolithography method in advance, and then embeds a wiring material and polishes it using a CMP (chemical mechanical polishing) technology to form a wiring pattern and a via contact.

Specifically, in a recent highly miniaturized semiconductor device including a semiconductor device in submicron or subquarter-micron size, Cu (copper) having low resistance as a conductor pattern is used in combination with an organic interlayer insulation film having low dielectric constant to avoid signal delay occurring in the multilayer wiring structure. In this event, Cu is hard to be dry-etched unlike Al, W or the like which has conventionally been used for a conductive pattern. Therefore, a dual damascene method is often used which forms in advance a wiring groove and a contact hole in an interlayer insulation film, and deposits a Cu layer by an electrolytic plating method or the like to fill the wiring groove and the contact hole as described above.

Generally, when the damascene method is used, a stopper and diffusion preventing film is formed between a lower interlayer insulation film and an upper interlayer insulation film to prevent diffusion of Cu and improve controllability in a direction of the depths of a wiring pattern and a contact hole.

FIG. 1 shows an example of a conventional multilayer wiring structure.

Referring to FIG. 1, after formation of a circuit element 4 on a semiconductor substrate 60 supporting an insulation film 10 and a via contact plug 70, an interlayer insulation film 11 is formed. On the interlayer insulation film 11, a not-shown photoresist film is applied, further, exposed to light, and developed to pattern the photoresist film into the shape of a wiring pattern 41. The interlayer insulation film 11 is then etched with a resist pattern (not shown) thus formed as a mask into the shape corresponding to the wiring pattern 41 desired to be formed, and a barrier metal film 31 is formed inside the wiring pattern 41. Further, the wiring pattern 41 is embedded thereon. Polishing is then performed using a CMP method to form the wiring pattern 41. Such a method is called a single damascene method. Incidentally, a via contact is composed of an adhesive film 70b covering the wall face inside a via hole and a metal film 70a formed on the adhesive film 70b.

After the formation of the wiring pattern 41, a stopper film and diffusion preventing film 21, an interlayer insulation film 12, an etching stopper film 22, and an interlayer insulation film 13 are sequentially formed. A not-shown resist is then exposed to light and developed on the interlayer insulation film 13 into the shape of a via pattern 51 desired to be formed. Etching is performed with a formed resist pattern as a mask until the top face of the stopper film and diffusion preventing film 21 is exposed. Another not-shown photoresist film is then applied, exposed to light, and developed to form a resist pattern which corresponds to a wiring pattern 42. The interlayer insulation film 13 is then etched with the resist pattern as a mask until the top face of the interlayer insulation film 12 is exposed.

In this event, the bottom portion of the via pattern 51 is concurrently etched to the top face of the wiring pattern 41. Further, a barrier metal film 32 is formed inside the wiring pattern 42 and inside the via pattern 51. A material for the wiring pattern 42 is further embedded therein. Polishing is then performed using the CMP method to form the via pattern 51 and the wiring pattern 42. Such a method is called a dual damascene method.

Typically, in manufacturing a semiconductor device such as an LSI or the like, after a wafer process of forming many semiconductor devices at once, a wafer is cut along scribe lines defining each semiconductor device in a dicing step so that the semiconductor wafer is separated into individual semiconductor devices or chips.

FIG. 2 shows a top view of a conventional semiconductor device. One-dotted chain lines 3 in FIG. 2 show portions to be diced. The dicing is performed along the outer peripheral portion of a semiconductor device 1.

Referring to FIG. 2, the semiconductor device 1 is formed with a moisture-proof ring 2 for preventing occurrence of cracks in dicing and intercepting entry of moisture or the like into the inside of the semiconductor device 1 for prevention of a decrease in yield of the semiconductor device 1, in such a manner that the moisture-proof ring 2 continuously surrounds the outer peripheral portion of the semiconductor device 1.

As a method of preventing the cracks and entry of moisture or the like, for example, a structure and a process shown in FIG. 3 are disclosed in Japanese Patent Laid-Open No. 2001-53148.

FIG. 3 shows a conventional moisture-proof ring structure.

Referring to FIG. 3, in forming wiring patterns and via contacts of a circuit portion, after formation of an interlayer insulation film 531 on a semiconductor substrate 501, a contact pattern 521 composed of an adhesive layer (not shown) and W is formed. A wiring pattern 541 composed of an AlCu layer which is vertically sandwiched between not-shown TiN/Ti layers is then formed above the contact pattern 521. Subsequently, after formation of an interlayer insulation film 532, via patterns 522 composed of an adhesive layer (not shown) and W are formed to the top face of the interlayer insulation film 531, at both ends of the wiring pattern 541 in a manner to be offset to the outside.

Subsequently, a wiring pattern 542 is processed direct on the via patterns 522, and an interlayer insulation film 533 is formed. Via patterns 523 composed of an adhesive layer (not shown) and W are formed at both ends of the wiring pattern 542 in a manner to be offset to the outside, using the same technique as that in forming the via patterns 522. Further, the whole from the top face of the semiconductor substrate 501 to the lower face of the interlayer insulation film 533 being the uppermost layer is covered with a TiN film or the like resistant to moisture or the like, thus forming a barrier structure.

In the structure of FIG. 3, a moisture-proof ring can be effectively formed by layering metal patterns excellent in adhesiveness. For employment of this method, however, the wiring material is limited to a material such as Al—Cu capable of being etched. This method is not applicable to a multilayer wiring structure including Cu wiring patterns which need to be formed by the damascene method. Such a structure is not formed either.

In the conventional dual damascene structure as shown in FIG. 1, there is a region not in contact with the via pattern 51 at the top of the wiring pattern 41 on a scribe line side 80. At the region, the stopper and diffusion preventing film 21 is in contact with the surface of the wiring pattern 41. Generally, an insulation film such as a SiN, SiC film or the like is used for the stopper and diffusion preventing film 21. The insulation film, however, has poor adhesiveness with a metal film in use for the wiring pattern 41. This causes a problem that the insulation film cannot prevent cracks at the interface between the insulation film and the wiring pattern 41 nor secure moistureproofness when moisture or the like enters.

Additionally, in the dual damascene structure as shown in FIG. 1, Cu is used as a wiring material. Cu, however, is hard to be patterned by etching, and thus the method shown in FIG. 3 is not applicable as described above.

SUMMARY OF THE INVENTION

The present invention is therefore made in consideration of the above-described situation, and its object is to provide a semiconductor device which can prevent cracks and suitably intercept entry of moisture or the like as well, and a method for manufacturing the same.

The present invention solves the aforementioned problem, through a semiconductor device, which includes: a semiconductor substrate; and a wiring structure including a first interlayer insulation film formed above the semiconductor substrate; a first conductor pattern formed in the first interlayer insulation film; a first barrier metal film formed between the first interlayer insulation film and the first conductor pattern to cover at least side faces of the first conductor pattern; a second interlayer insulation film formed on the first interlayer insulation film; a second conductor pattern formed above the first conductor pattern with the second interlayer insulation film intervening therebetween; a via contact portion formed in the second interlayer insulation film to connect the first conductor pattern to the second conductor pattern; and a second barrier metal film formed to cover side faces and a bottom face of the via contact portion, wherein the wiring structure is formed to continuously extend such that a bottom face portion of the second barrier metal film, covering the bottom face of the via contact portion, of the second barrier metal film, is formed in contact with at least a portion of an upper end portion of the first barrier metal film.

Further, the present invention solves the aforementioned problem through a method for manufacturing a semiconductor device including a continuously extending wiring structure, which includes the steps of: for forming the wiring structure, forming a first interlayer insulation film above a semiconductor substrate; forming, in the first interlayer insulation film, a first conductor pattern, and a first barrier metal film covering at least side faces of the first conductor pattern between the first interlayer insulation film and the first conductor pattern; forming a second interlayer insulation film on the first interlayer insulation film; and forming, in the second interlayer insulation film, a via contact portion for connecting the first conductor pattern to a second conductor pattern to be formed above the first conductor pattern, and a second barrier metal film covering side faces and a bottom face of the via contact portion, wherein the wiring structure is formed such that a bottom face portion of the second barrier metal film, covering the bottom face of the via contact portion, of the second barrier metal film, is in contact with at least a portion of an upper end portion of the first barrier metal film.

As described above, the semiconductor device of the present invention and the semiconductor device manufactured by the method for manufacturing a semiconductor device of the present invention, are configured such that the barrier metal bottom face portion, covering the bottom face of the via contact portion, of the second barrier metal film is in contact with at least a portion of the upper end portion of the first barrier metal film. Therefore, according to the present invention, the adhesiveness between the upper end portion of the first barrier metal film and an upper layer is enhanced to enable prevention of entry of moisture or the like at a connecting portion, as a boundary, between the upper end portion of the first barrier metal film and the barrier metal bottom face portion. This can solve problems that the first conductor pattern formed inside the first barrier metal film is corroded and the like.

BRIEF DESCRIPTION OF THE DRAWINGS

FIGS. 4A and 4B are views (first) showing a manufacturing process of a semiconductor device according to a first embodiment of the present invention;

FIGS. 6A and 6B are views (third) showing the manufacturing process of the semiconductor device according to the first embodiment of the present invention;

DETAILED DESCRIPTION OF THE PREFERRED EMBODIMENTS

Figure 1:
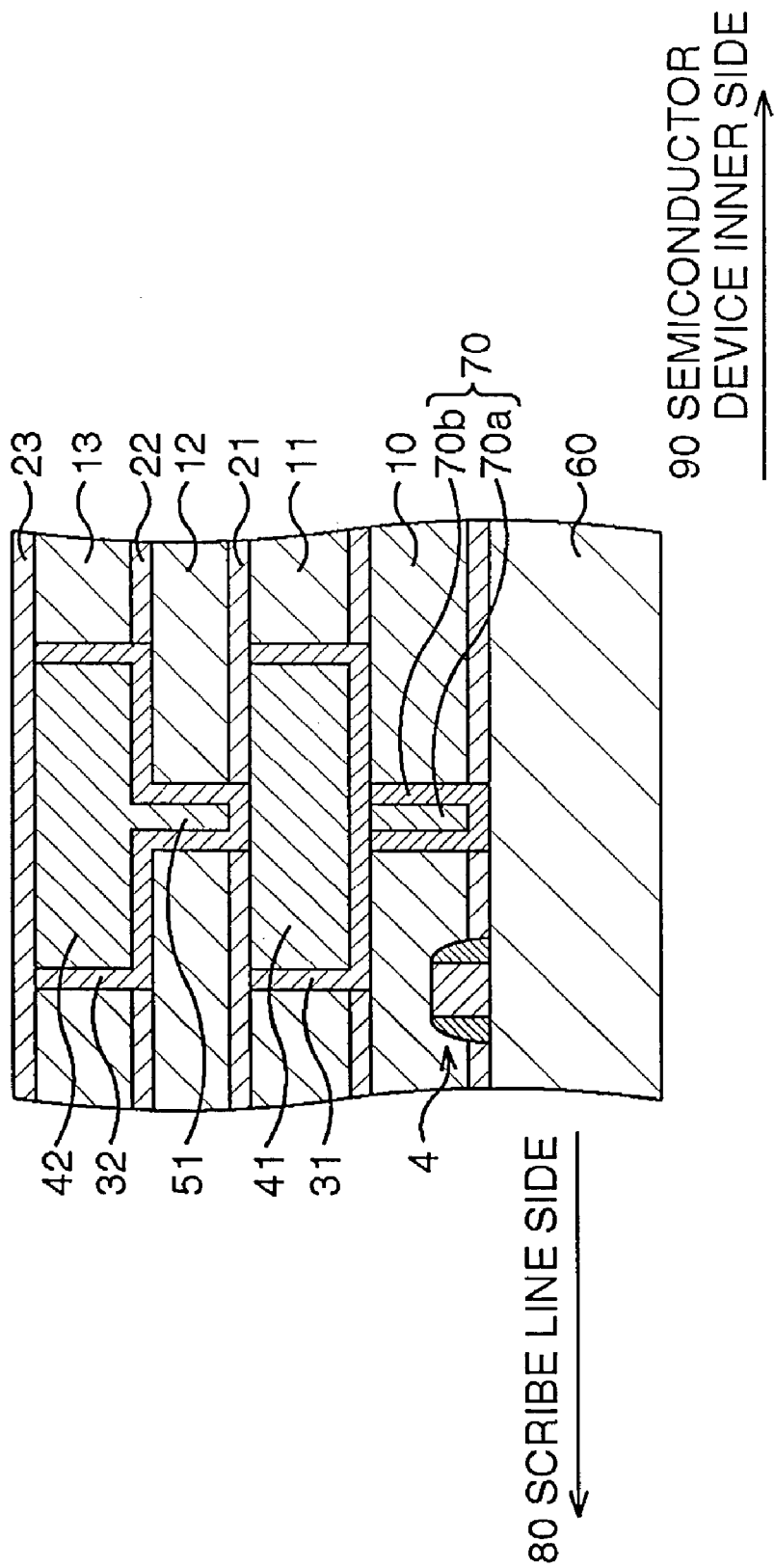
FIG. 1 is a cross-sectional view showing a conventional multilayer wiring structure.

Hereinafter, embodiments of the present invention will be described with reference to the drawings.

First Embodiment

FIG. 4A to FIG. 15B show steps of manufacturing a moisture-proof ring according to a first embodiment of the present invention when a dual damascene method is used. In the drawings, the left-hand side is a scribe line side 80, and the right-hand side is a semiconductor device inner side 90. Pointing a wall will show the whole space like a resist window 131a in FIG. 4A.

Step of Patterning Photoresist Film for Forming Contact

Referring to FIG. 4A, after formation of a not-shown circuit element on a semiconductor substrate 101, a silicon nitride film 111 and a silicon oxide film 121 are formed on and above the semiconductor substrate 101 to have thicknesses of 100 nm and 900 nm, respectively. To flatten the circuit element portion, the silicon oxide film 121 is polished using a CMP method so that the silicon oxide film 121 is formed to have a thickness of 600 nm. On the silicon oxide film 121, a photoresist film 131 is then applied, exposed to light, and further developed to form a resist window 131a which corresponds to a contact pattern desired to be formed.

Step of Etching Silicon Oxide Film in Contact Portion

Next, in the step of FIG. 4B, the silicon oxide film 121 is etched through the resist window 131a to form an opening 121a in the silicon oxide film 121. The etching of the silicon oxide film 121 is performed by a plasma etching method using $C_4F_8$ gas, CO gas, $O_2$ gas, Ar gas, or the like.

Step of Etching Silicon Nitride Film in Contact Portion

Figure 5A:
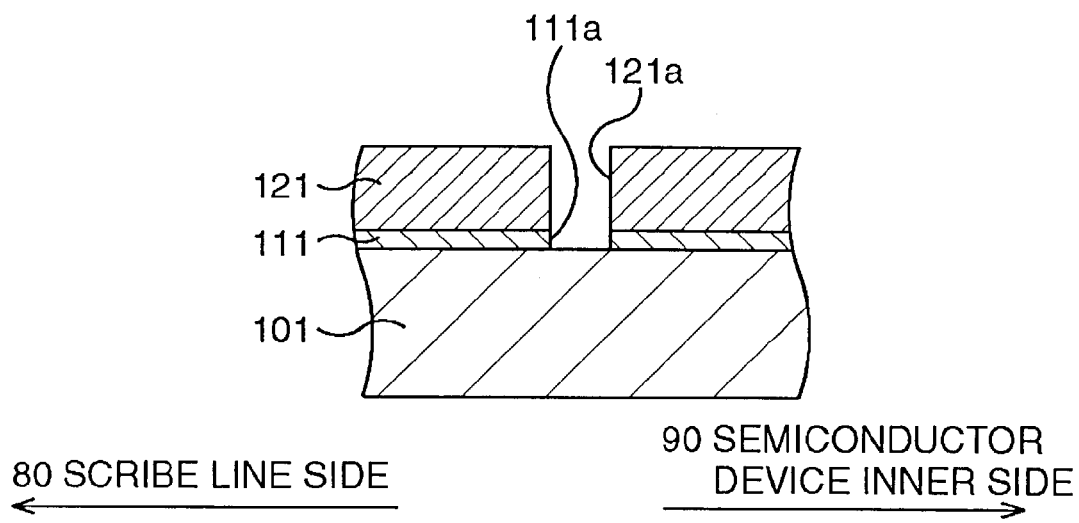
FIGS. 5A and 5B are views (second) showing the manufacturing process of the semiconductor device according to the first embodiment of the present invention.

Next, in the step of FIG. 5A, the photoresist film 131 is removed by ashing. Etching is performed with the silicon oxide film 121 as a mask to transfer the shape of the opening 121a to the silicon nitride film 111 for formation of an opening 111a in the silicon nitride film 111.

Etching of the silicon nitride film 111 can be performed by a plasma etching method using $CF_4$ gas, $CHF_3$ gas, $O_2$ gas, Ar gas, or the like. In this event, the opening 111a continues vertically from the opening 121a to form a contact hole.

Step of Forming Metal Film inside Contact

Figure 5B:
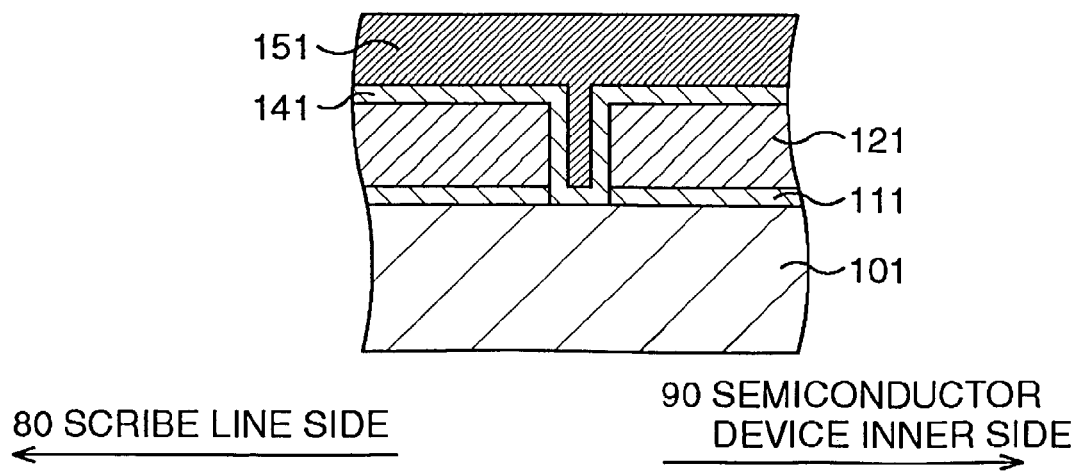

Next, in the step of FIG. 5B, a TiN film 141, as an adhesive layer, is formed to have a thickness of 50 nm inside the contact hole and on the silicon oxide film 121. A tungsten film 151 is subsequently formed to have a thickness of 400 nm.

CMP Step for Forming Contact

Next, in the step of FIG. 6A, the tungsten film 151 and the TiN film 141 are polished using the CMP method to remain only inside the contact hole. The remaining tungsten film 151 and TiN film 141 are used as a contact pattern 161.

Step of Patterning Photoresist Film for Forming Wiring

Next, in the step of FIG. 6B, a silicon nitride film 112 and a silicon oxide film 122 are formed to have thicknesses of 70 nm and 500 nm, respectively. On the silicon oxide film 122, a photoresist film 132 is applied, exposed to light, and further developed to form a resist window 132*a* which corresponds to a wiring pattern desired to be formed.

Step of Etching Silicon Oxide Film for Wiring

Figure 7A:
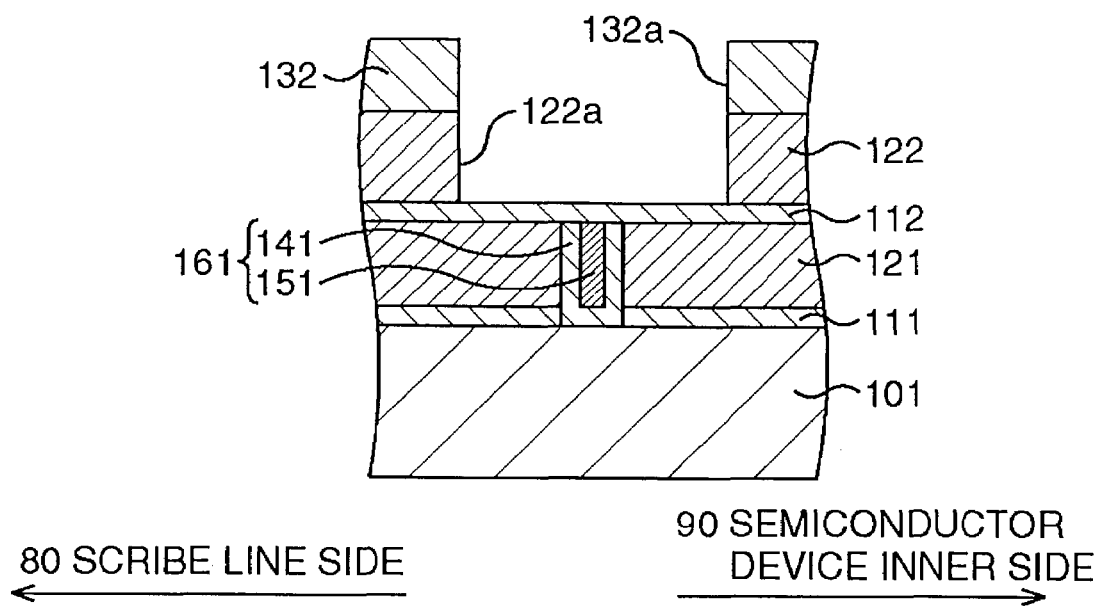
FIGS. 7A and 7B are views (fourth) showing the manufacturing process of the semiconductor device according to the first embodiment of the present invention.

Next, in the step of FIG. 7A, the silicon oxide film 122 is etched through the resist window 132*a* to form in the silicon oxide film 122 an opening 122*a* which constitutes a wiring groove.

Step of Etching Silicon Nitride Film for Wiring

Figure 7B:
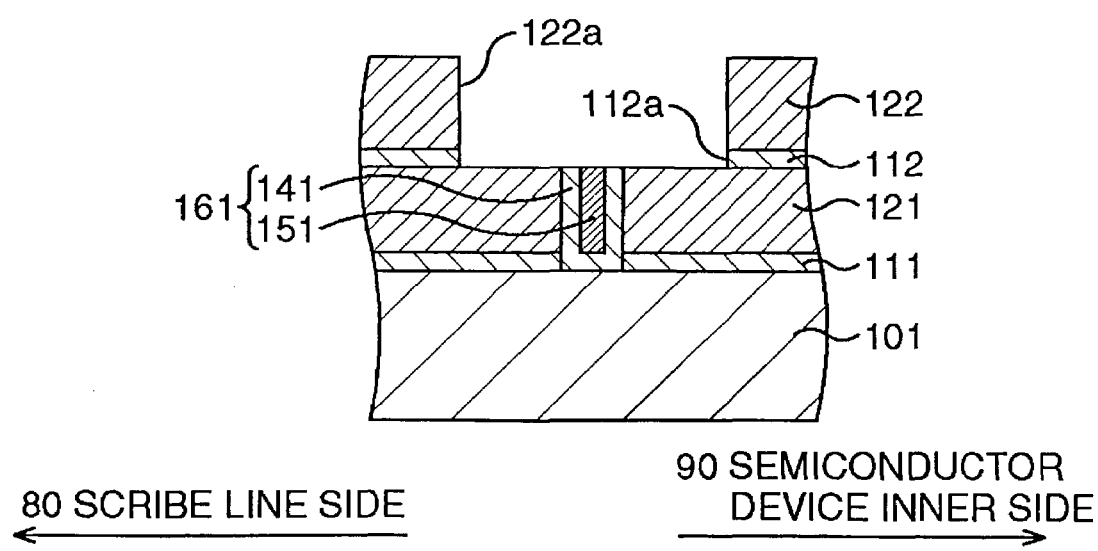

Next, in the step of FIG. 7B, the photoresist film 132 is removed by ashing. Etching is performed with the silicon oxide film 122 as a mask to transfer the shape of the opening 122*a* to the silicon nitride film 112 for formation of an opening 112*a* which corresponds to the opening 122*a* in the silicon nitride film 112. The opening 112*a* and the opening 122*a* vertically continue to form a later-described wiring pattern 171.

Step of Film Forming of Material for Wiring

Figure 8:
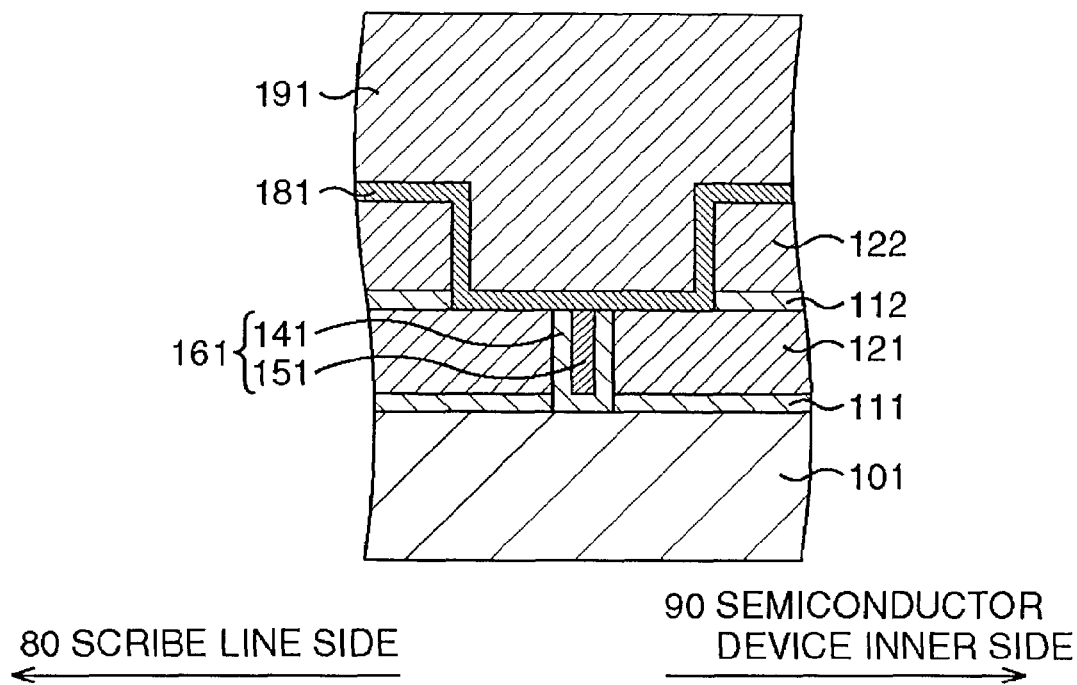
FIG. 8 is a view (fifth) showing the manufacturing process of the semiconductor device according to the first embodiment of the present invention.

Next, in the step of FIG. 8, a Ta film 181, as a barrier metal film, is formed to have a thickness of 30 nm inside the later-described wiring pattern 171 and on the silicon oxide film 122. A Cu film 191, as a wiring material, is subsequently formed to have a thickness of 1600 nm by a sputtering or electrolytic plating method. It should be noted that when the Cu film is formed using the electrolytic plating method, the barrier metal film is formed, and a Cu film as a seed layer is then formed before the formation of the Cu film by the electrolytic plating method.

CMP Step for Forming Wiring

Figure 9:
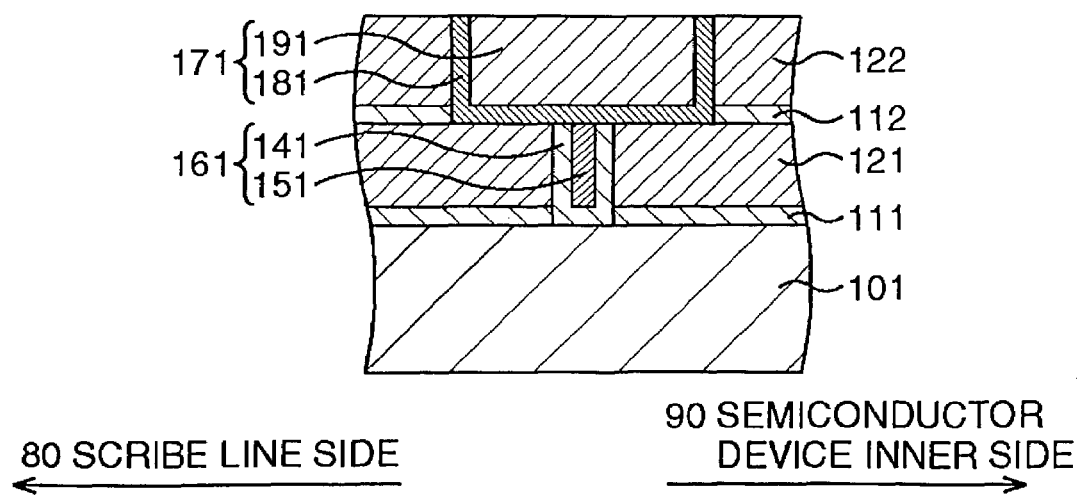
FIG. 9 is a view (sixth) showing the manufacturing process of the semiconductor device according to the first embodiment of the present invention.

Next, in the step of FIG. 9, the Ta film 181 and the Cu film 191 are polished using the CMP method to remain only inside the wiring pattern 171, thus forming the wiring pattern 171.

Step of Patterning Resist Film for Forming Via Pattern

Figure 10:
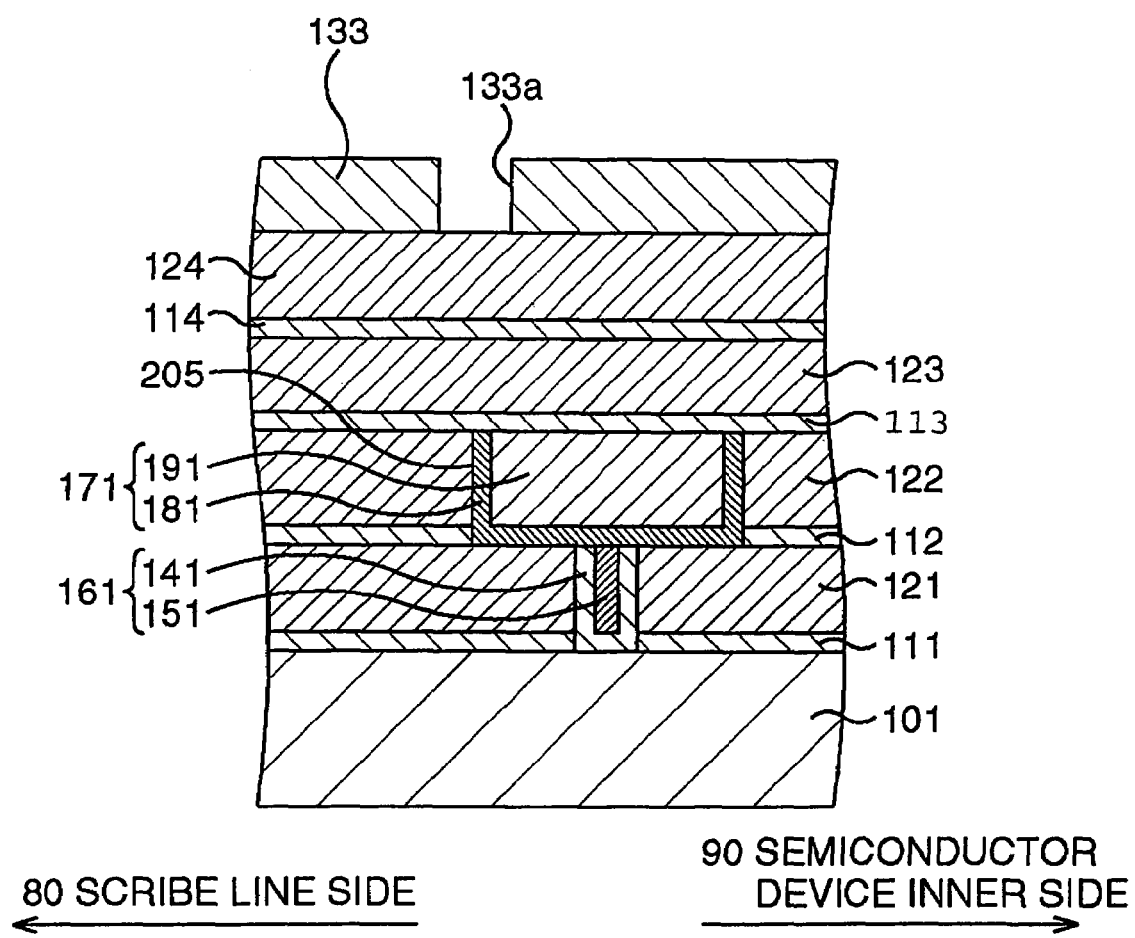
FIG. 10 is a view (seventh) showing the manufacturing process of the semiconductor device according to the first embodiment of the present invention.

Next, in the step of FIG. 10, a silicon nitride film 113, a silicon oxide film 123, a silicon nitride film 114, and a silicon oxide film 124 are formed on and above the wiring pattern 171 to have thicknesses of 70 nm, 650 nm, 70 nm, and 500 nm, respectively. On the silicon oxide film 124, a photoresist film 133 is applied, exposed to light, and further developed to form a photoresist window 133*a* which corresponds to a via pattern desired to be formed.

In the example shown in the drawing, the photoresist window 133*a* is formed in such a manner that a first outer peripheral portion 205, covering a sidewall face on the outer peripheral side of the Cu film 191 being the wiring pattern 171, on a scribe line side 80 of the Ta film 181 being the barrier metal film is included in the window 133*a* for the via pattern.

Figure 11:
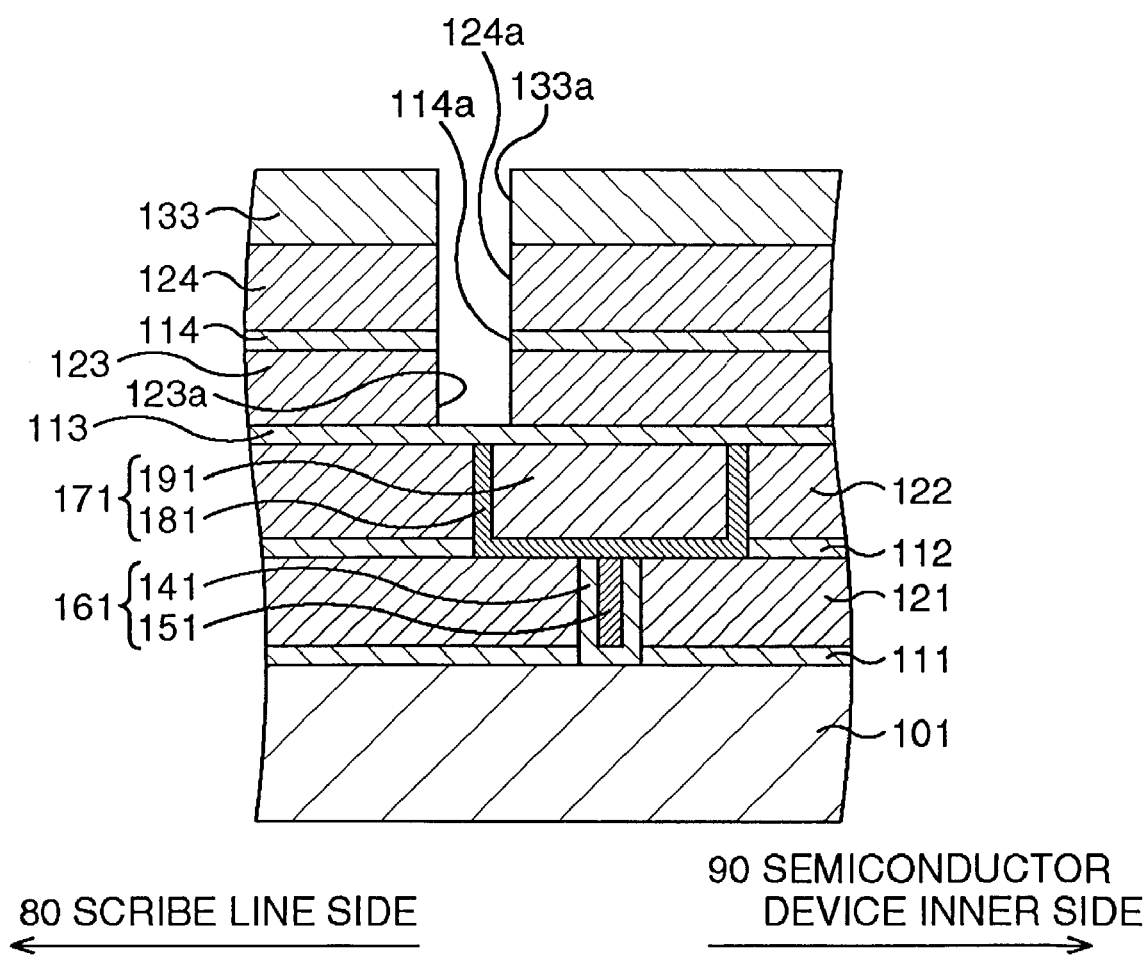
FIG. 11 is a view (eighth) showing the manufacturing process of the semiconductor device according to the first embodiment of the present invention.

Step of Forming Via Pattern and Step of Patterning Photoresist Film for Wiring Next, in the step of FIG. 11, the silicon oxide film 124, the silicon nitride film 114, and the silicon oxide film 123 are etched with the photoresist film 133 as a mask to transfer the shape of the opening 133*a* to the silicon oxide film 124, the silicon nitride film 114, and the silicon oxide film 123 for formation of an opening 124*a*, an opening 114*a*, and an opening 123*a*, respectively.

The etching of the silicon oxide film 124 and the silicon oxide film 123 can be performed by the plasma etching method using $C_4F_8$ gas, CO gas, $O_2$ gas, Ar gas, or the like. On the other hand, the etching of the silicon nitride film 114 can be performed by a plasma etching method using $CF_4$ gas, $CHF_3$ gas, $O_2$ gas, Ar gas, or the like.

Thereafter, the photoresist film 133 is removed by ashing.

Figure 12:
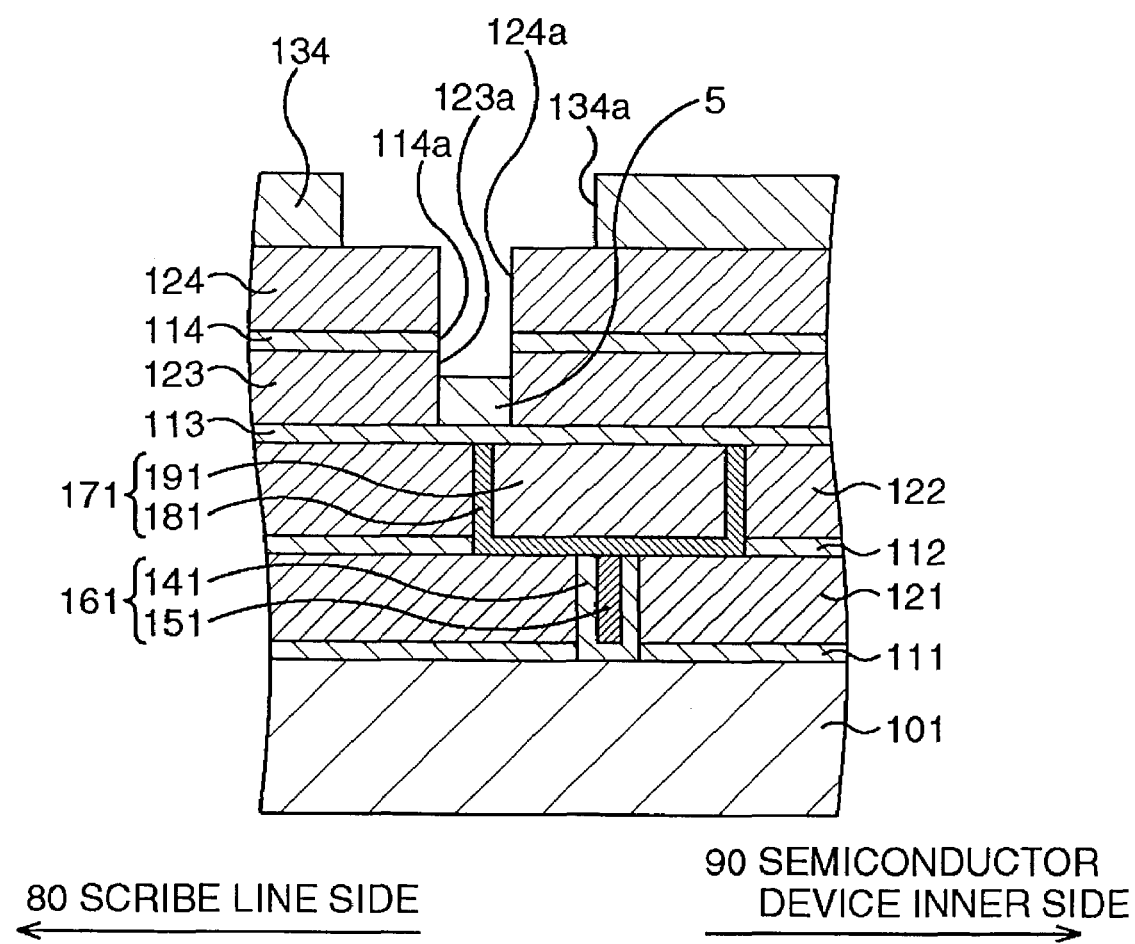
FIG. 12 is a view (ninth) showing the manufacturing process of the semiconductor device according to the first embodiment of the present invention.

In the step of FIG. 12, a nonphotosensitive resin is applied to the surface above the semiconductor substrate and dissolved from its surface to leave a nonphotosensitive resin filler 5 only in the opening 123*a* which is formed on the silicon nitride film 113. On the silicon oxide film 124, a photoresist film 134 is then applied, exposed to light, and further developed to form a resist window 134*a* which corresponds to a wiring pattern desired to be formed.

Step of Etching for Forming Wiring

Figure 13:
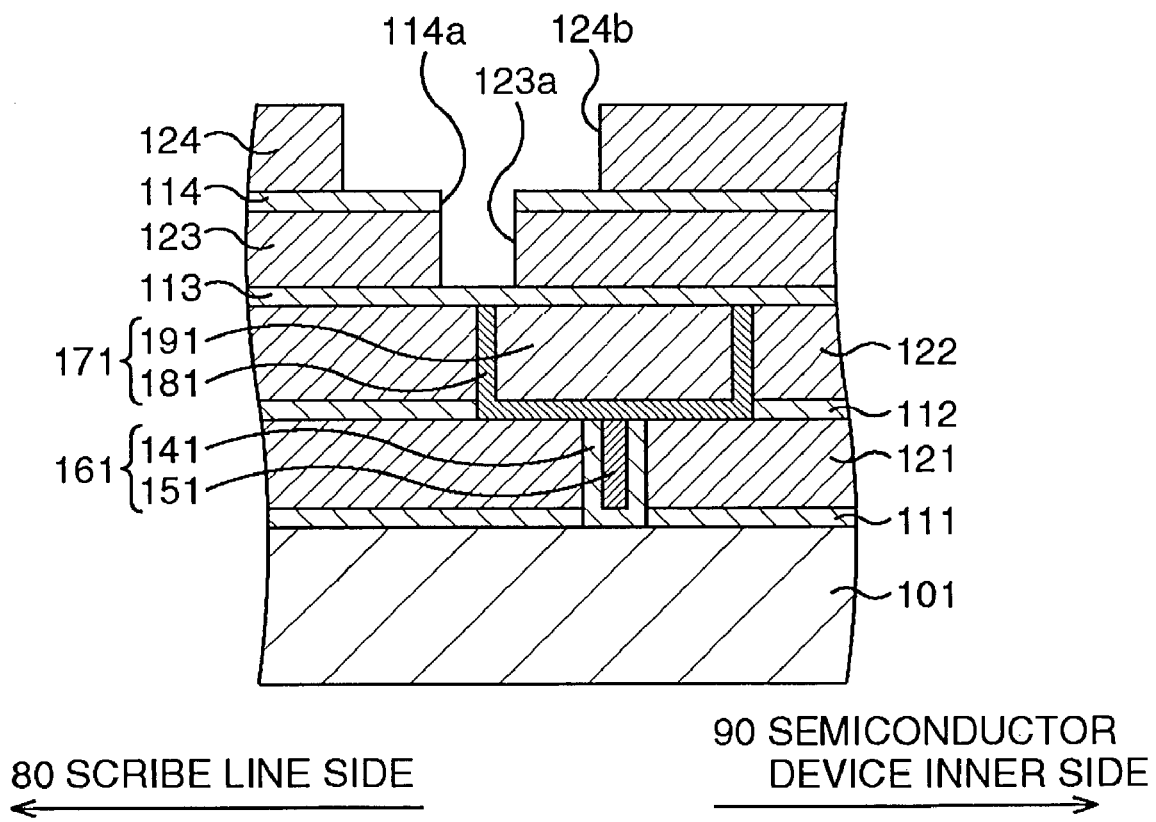
FIG. 13 is a view (tenth) showing the manufacturing process of the semiconductor device according to the first embodiment of the present invention.

Next, in the step of FIG. 13, etching is performed with the photoresist film 134 as a mask to transfer the shape of the opening 134*a* to the silicon oxide film 124 for formation of an opening 124*b* in the silicon oxide film 124. Thereafter, the photoresist film 134 is removed by ashing.

In this event, the nonphotosensitive resin filler 5 is concurrently removed.

Next, the shape of the opening 124*b* is transferred, with the silicon oxide film 124 as a mask, to the silicon nitride film 114 to form an opening corresponding thereto. Concurrently, the silicon nitride film 113 is etched with the silicon oxide film 123 as a mask. As a result, as shown in FIG. 14, the shape of the opening 123*a* is transferred to the silicon nitride film 113.

When the silicon oxide film 124 and the silicon nitride film 113 are etched, it is preferable to perform 100% overetching using an etching condition of a 1:1 ratio etching rate between the silicon oxide film 124 and the silicon nitride film 113.

Figure 14:
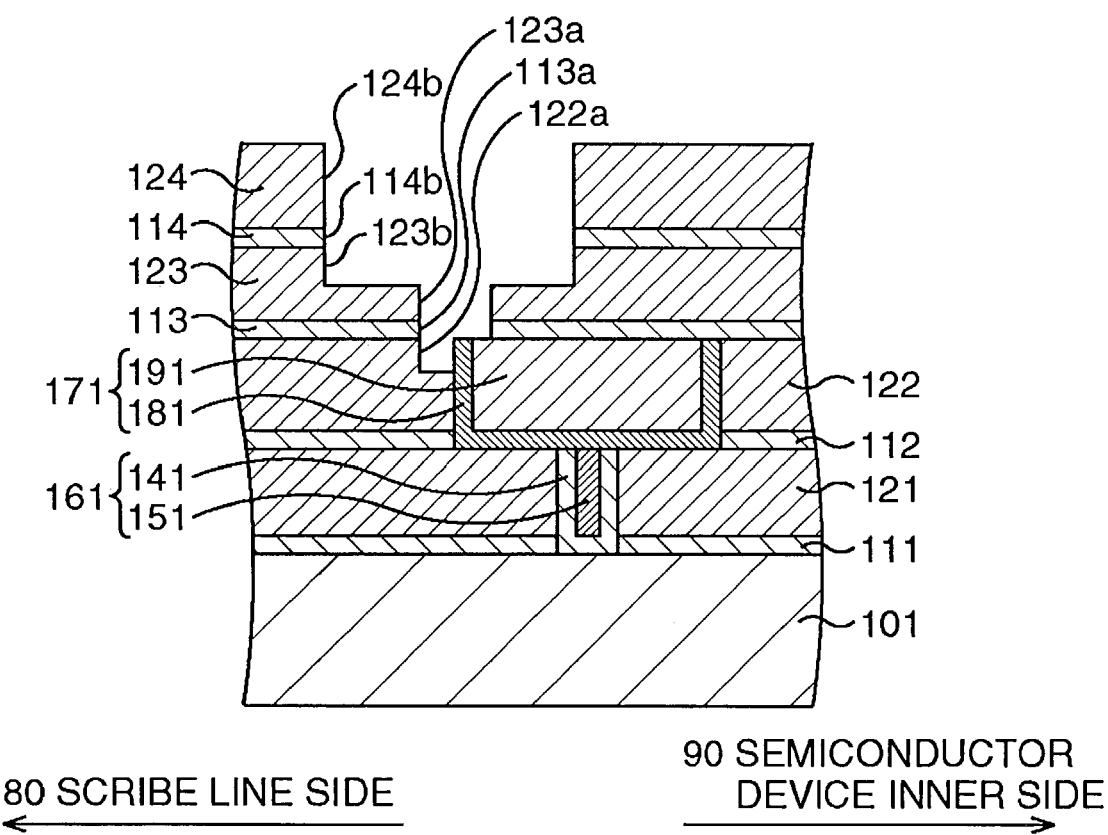
FIG. 14 is a view (eleventh) showing the manufacturing process of the semiconductor device according to the first embodiment of the present invention.

Further, in the step of FIG. 14, the shape of the opening 124*b* in the silicon oxide film 124 is transferred to the silicon oxide film 123 which is etched by only a thickness of 70 nm to form an opening 123*b*.

In the step of FIG. 14, concurrently therewith, the shape of the opening 123*a* in the silicon oxide film 123 is transferred to the silicon oxide film 122. As a result, the silicon oxide film 122 is also etched by a thickness of 70 nm to form an opening 122*a* in the silicon oxide film 122.

The opening 124*b*, the opening 114*b*, and the opening 123*b* are used as a later-described wiring pattern 172. The opening 123*a*, the opening 113*a*, and the opening 122*a* are used as a later-described via pattern 201.

Step of Forming Metal Film for Forming Via Pattern and Wiring

Figure 15A:
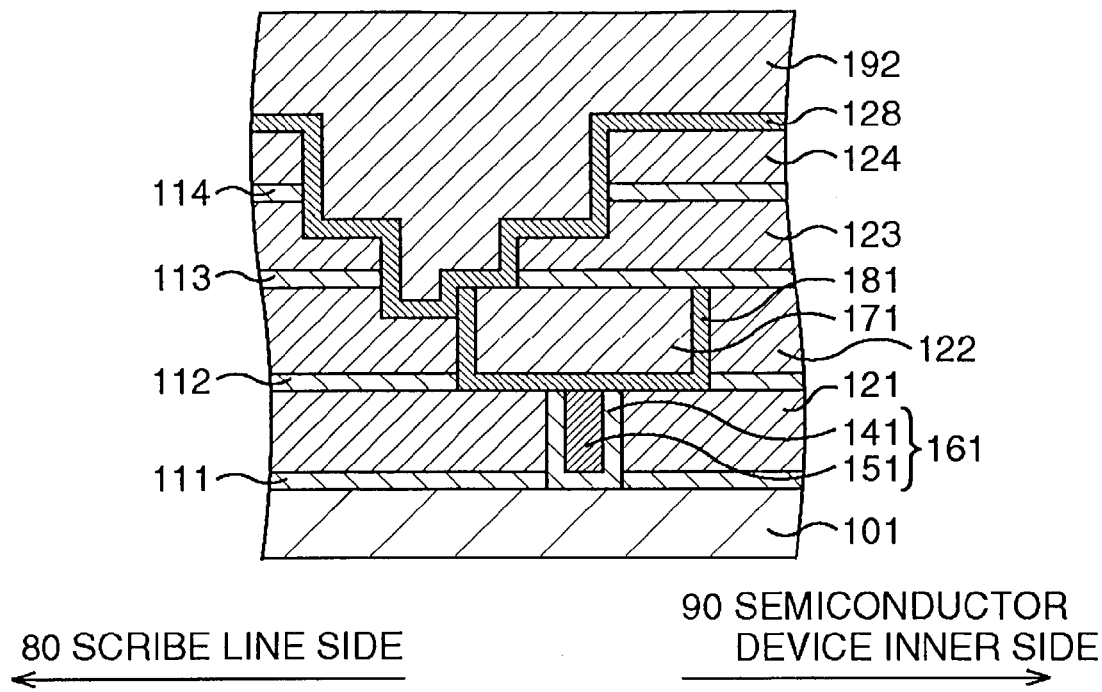
FIGS. 15A and 15B are views (twelfth) showing the manufacturing process of the semiconductor device according to the first embodiment of the present invention.

Next, as shown in FIG. 15A, a Ta film 182, as a barrier metal film, is formed to have a thickness of 30 nm inside the later-described wiring pattern 172 and via pattern 201 and on the silicon oxide film 124. A Cu film 192, as a wiring material, is subsequently formed to have a thickness of 1600 nm by the sputtering or electrolytic plating method. It should be noted that when the Cu film is formed using the electrolytic plating method, the barrier metal film is formed, and a Cu film as a seed layer is then formed before the formation of the Cu film by the electrolytic plating method.

CMP Step for Forming Via Pattern and Wiring

Figure 15B:
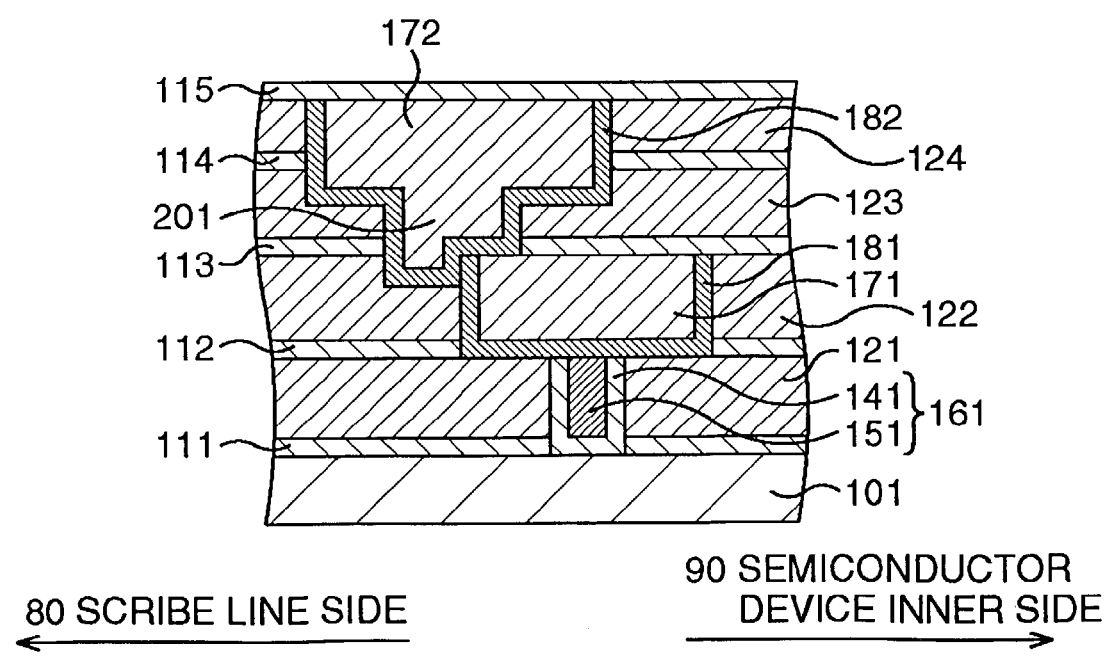

Next, as shown in FIG. 15B, the Ta film 182 and the Cu film 192 are polished using the CMP method to remain inside the wiring pattern 172 and inside the via pattern 201. The remaining Ta film 182 and Cu film 192 are used as the wiring pattern 172. Further, on the silicon oxide film 124, a silicon nitride film 115, which will be a diffusion preventing film, is formed in a manner to cover the wiring pattern 172, thus forming a moisture-proof ring.

Referring to FIG. 15B, the moisture-proof ring of this embodiment has such a structure that the sidewall face on the outer peripheral side of the Cu film 191 constituting the wiring pattern 171 is covered with the Ta film 181, and a region near the sidewall face on the outer peripheral side of the top face of the Cu film 191 is covered, continuously from the Ta film 181, with the Ta film 182 which covers the Cu film 192 constituting the via pattern 201. In addition, a region near the upper end portion of the sidewall face on the outer peripheral side of the Cu film 191 is covered not only with the Ta film 181 but also with the Ta film 182 which is formed on the outside thereof. In short, the upper end portion of the sidewall face on the outer peripheral side of the Cu film 191 is covered with a dual structure of Ta films.

This results in excellent adhesiveness between the wiring pattern 171 and the wiring pattern 172, and a long path of entry of moisture because of bending in the structure of FIG. 15B, thus enabling effective prevention of entry of moisture.

Figure 2:
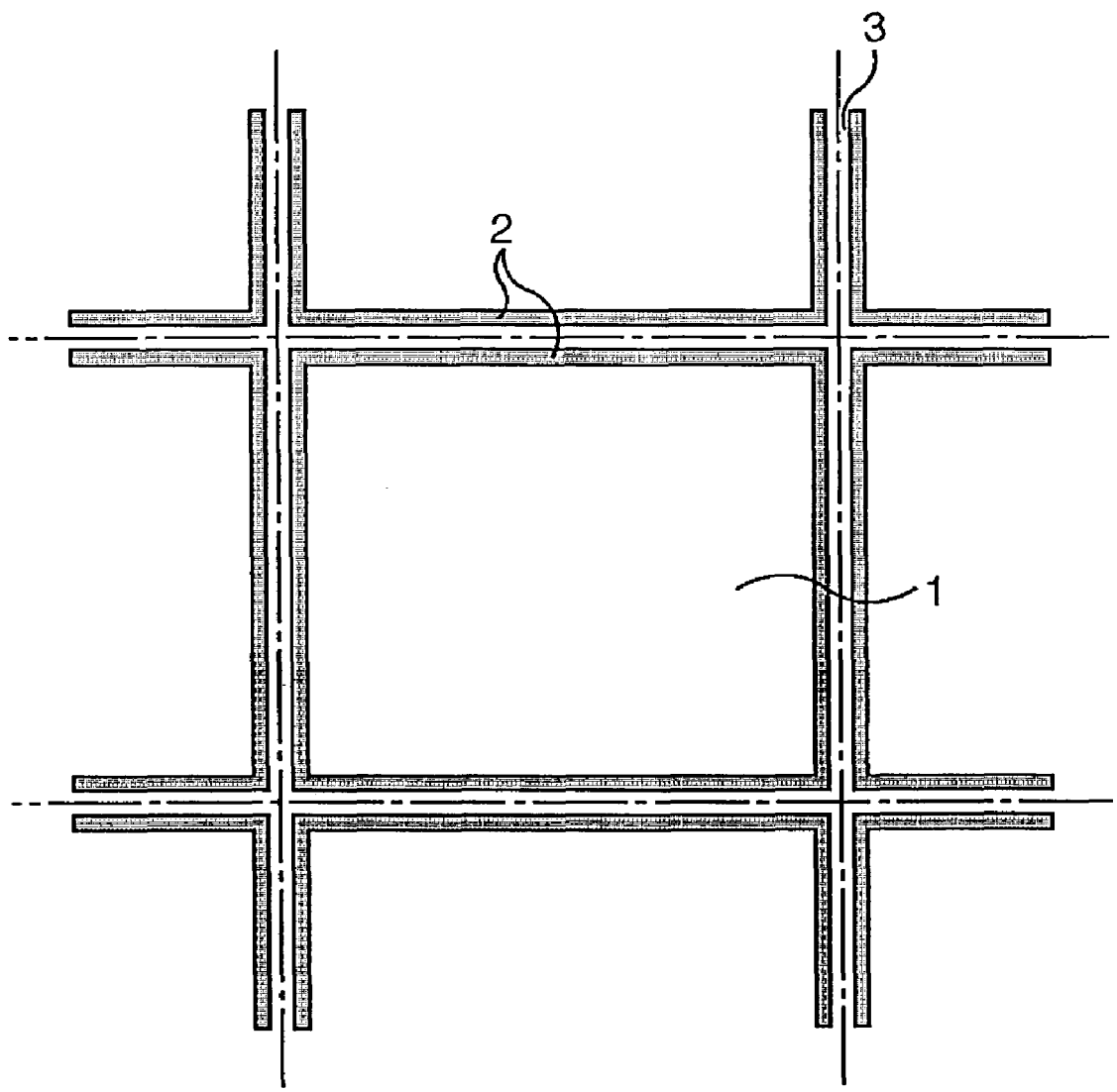
FIG. 2 is a top view of a conventional semiconductor device.
Figure 3:
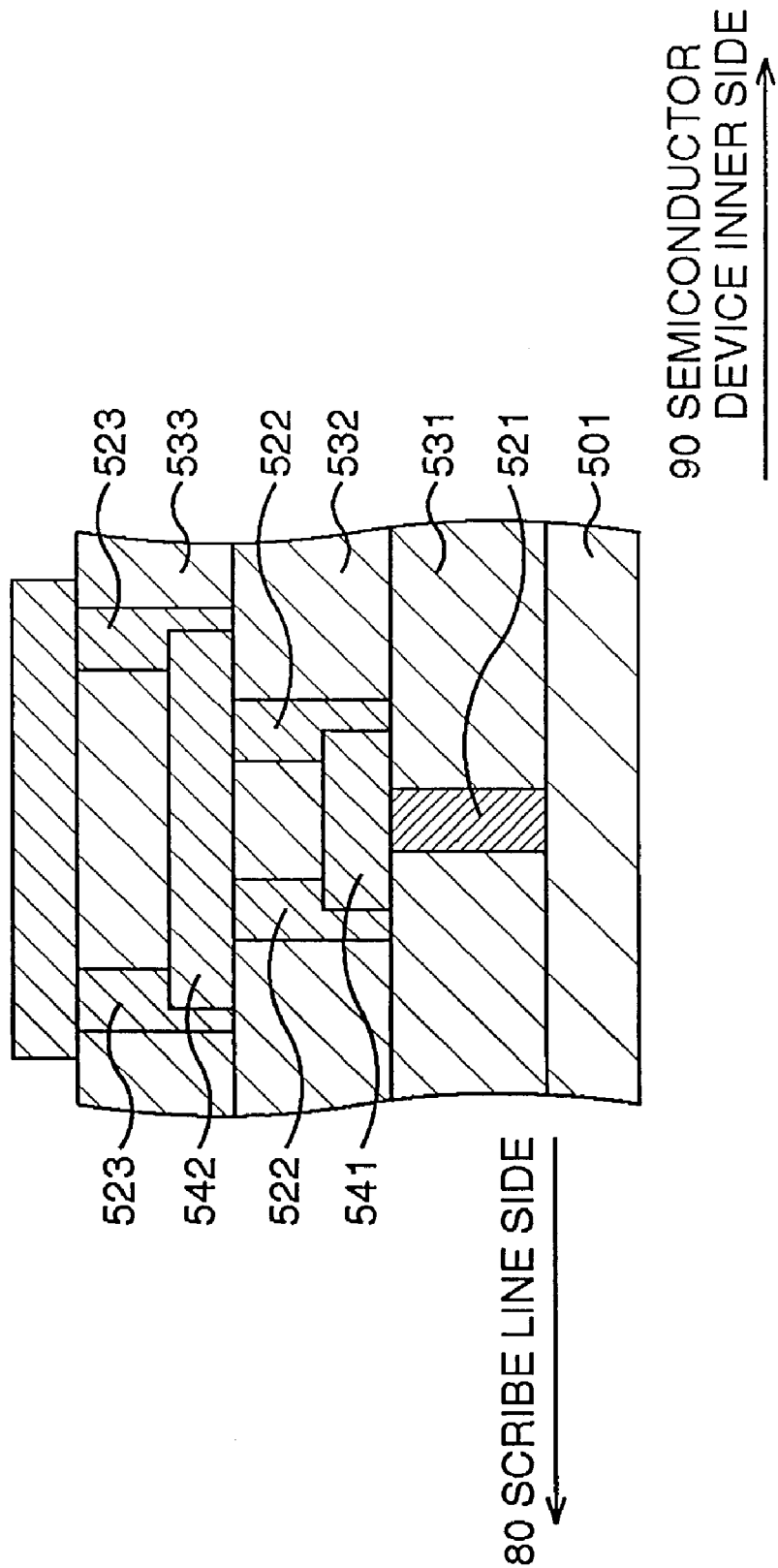
FIG. 3 is a cross-sectional view showing a conventional moisture-proof ring structure.

It should be noted that the conductor patterns 171 and 172 are described as the wiring patterns in the above embodiment because these conductor patterns are formed together concurrently with the corresponding wiring patterns in a multilayer wiring structure by similar processes. Accordingly, the conductor patterns 171 and 172 are not always used for electric wiring in an integrated circuit device. The member 201 is described as a "via plug" in relation to the step of forming an ordinal multilayer wiring structure in the above description. The member 201, however, actually extends continuously along the outer periphery of a chip in the moisture-proof ring to form a via wall as is clear from the plane view of FIG. 2.

Second Embodiment

Figure 16A:
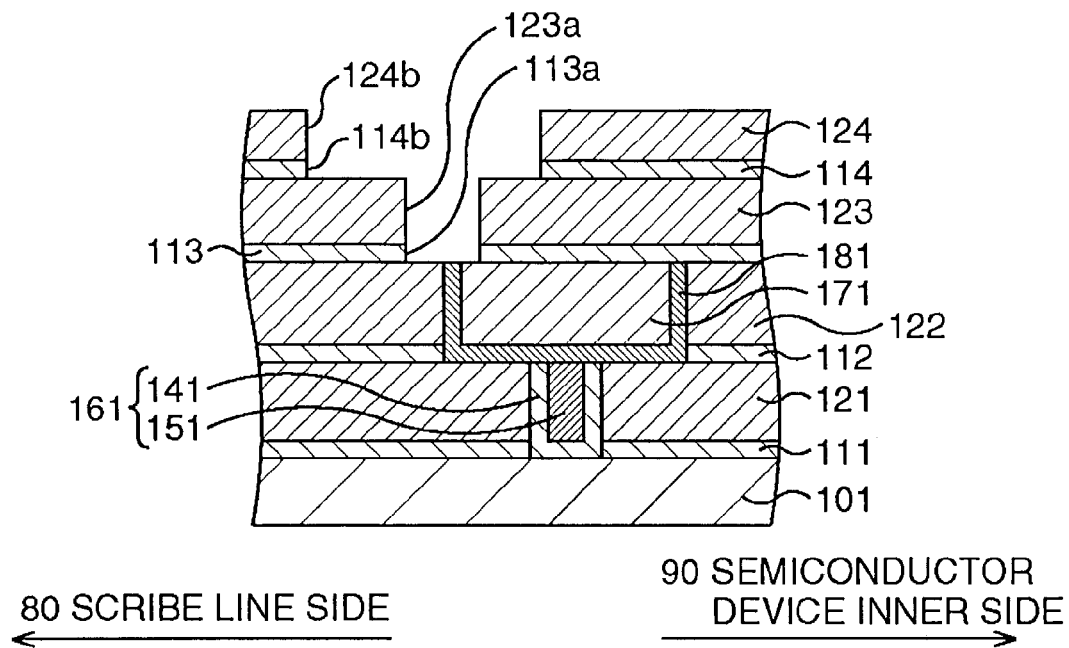
FIGS. 16A and 16B are views (first) showing a manufacturing process of a semiconductor device according to a second embodiment of the present invention.
Figure 16B:
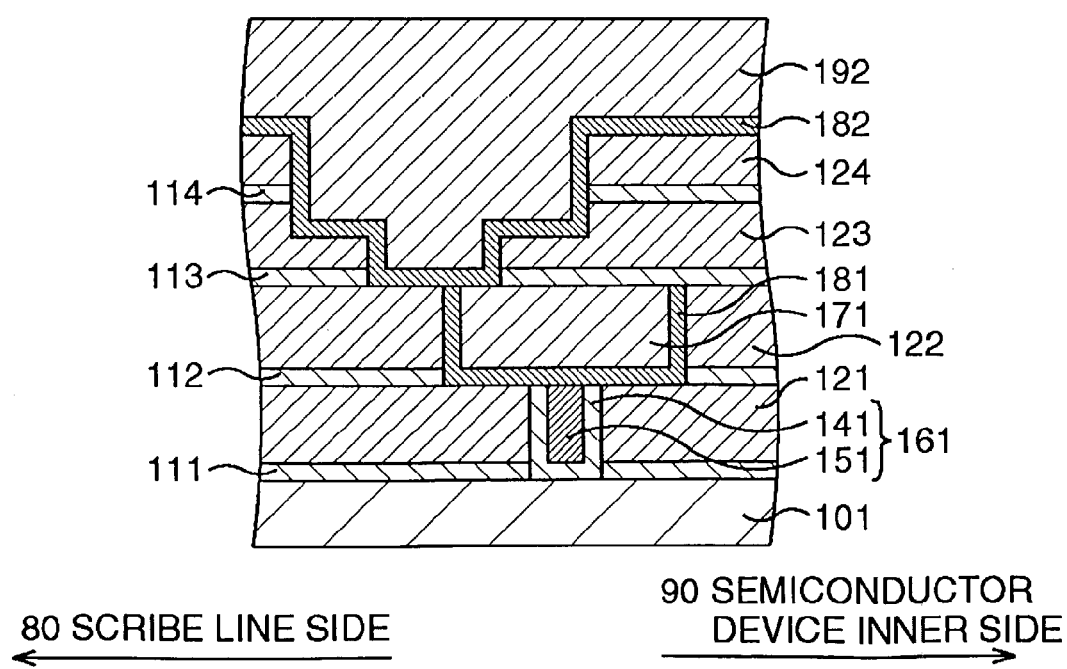
Figure 17:
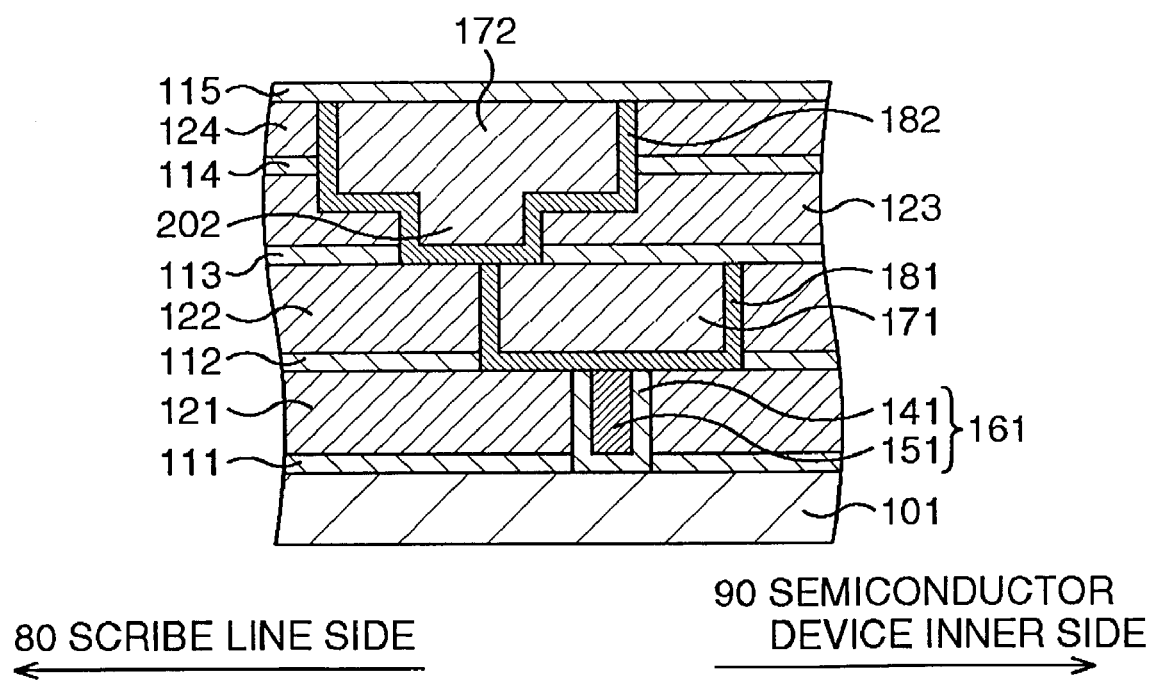
FIG. 17 is a view (second) showing the manufacturing process of the semiconductor device according to the second embodiment of the present invention.

FIG. 16A to FIG. 17 show steps of manufacturing a semiconductor device according to a second embodiment of the present invention. In the drawings, the same reference numbers are assigned to portions corresponding to the previously described portions, and the description thereof is omitted.

Step of Etching Silicon Oxide Film for Forming Wiring

Referring to FIG. 16A, in this embodiment, after the formation of the structure shown in FIG. 13, the silicon nitride film 114 under the opening 124b in the silicon oxide film 124 and the silicon nitride film 113 under the opening 123a in the silicon oxide film 123 are etched under the condition that no overetching is performed.

As a result, as shown in FIG. 16A, the shape of the opening 124b is transferred, with the silicon oxide film 124 as a mask, to the silicon nitride film 114 to form an opening 114b. Concurrently, the silicon nitride film 113 is also etched with the silicon oxide film 123 as a mask, so that the shape of the opening 123a is transferred to the silicon nitride film 113 to form an opening 113a.

The opening 124b and opening 114b thus formed are used as a wiring pattern 172, and the opening 123a and the opening 113a are used as a via pattern 202.

Step of Forming Metal Film for Forming Via Pattern and Wiring

Next, in the step of FIG. 16B, as in the first embodiment, a Ta film 182, as a barrier metal film, is formed to have a thickness of 30 nm inside the later-described wiring pattern 172 and via pattern 202 and on the silicon oxide film 124. A Cu film 192, as a wiring material, is subsequently formed to have a thickness of 1600 nm by the sputtering or electrolytic plating method.

CMP Step for Forming Via Pattern and Wiring

Thereafter, in the step of FIG. 17, the Ta film 182 and the Cu film 192 are polished using the CMP method to form the wiring pattern 172. A silicon nitride film 115, which will be a diffusion preventing film, is formed on the wiring pattern 172 formed as described above in FIG. 17, thus forming a semiconductor device.

In the case of the structure of a moisture-proof ring according to this embodiment, the bottom portion of the Ta film 182 constituting the barrier metal film of the via pattern 202 is formed in a manner to be in contact with the upper end portion of the Ta film 181 covering the sidewall face on the outer peripheral side of the wiring pattern 171 composed of the Cu film 191. The interface between them, where metal films such as Ta film/Ta film or Ta film/Cu film are in contact with each other, has a structure with strong adhesiveness, which can prevent propagation of cracks, for example, in a dicing process.

In addition, the sidewall face on the outer peripheral side and the top face of the wiring pattern are continuously covered with the Ta film 181 or 182. This structure can intercept moisture or the like which enters along the interface between the silicon oxide film 122 and the silicon nitride film 113 or the interface between the silicon oxide film 123 and the silicon nitride film 114, thus improving the reliability of the semiconductor device.

Third Embodiment

FIG. 18A to FIG. 20 show steps of manufacturing a semiconductor device according to a third embodiment of the present invention. In the drawings, the same reference numbers are assigned to the previously described portions, and the description thereof is omitted.

Step of Patterning Photoresist Film for Forming Via Pattern

Figure 18A:
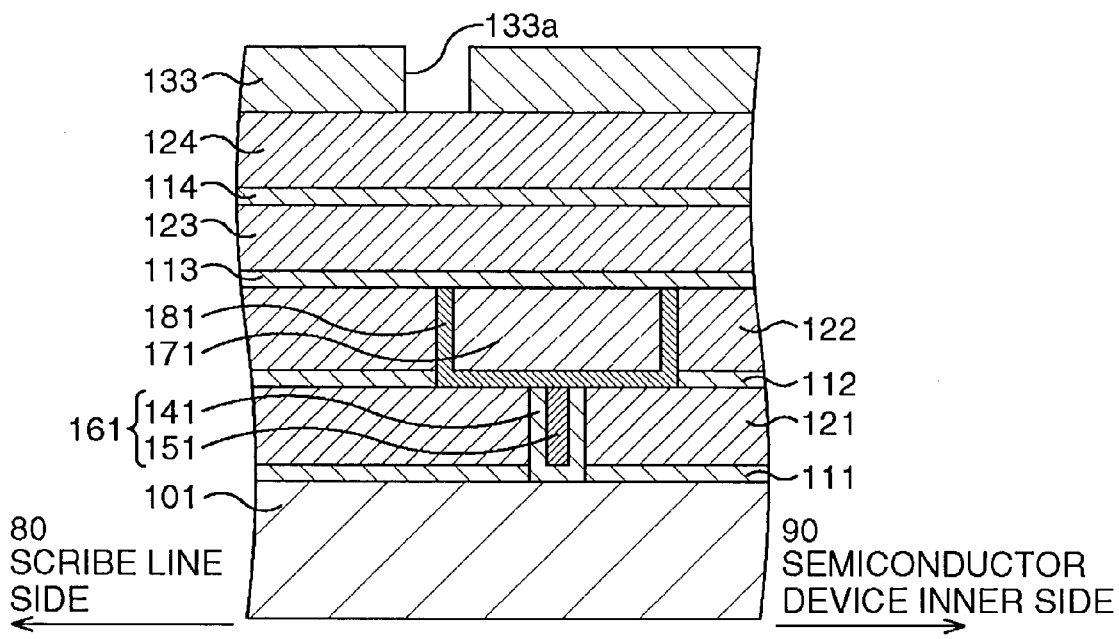
FIGS. 18A and 18B are views (first) showing a manufacturing process of a semiconductor device according to a third embodiment of the present invention.

Referring to FIG. 18A, in this embodiment, a silicon nitride film 113, a silicon oxide film 123, a silicon nitride film 114, and a silicon oxide film 124 are formed on and above a wiring pattern 171 to have thicknesses of 70 nm, 650 nm, 70 nm, and 500 nm, respectively. On the silicon oxide film 124, a photoresist film 133 is applied, exposed to light, and further developed to form a photoresist window 133a which corresponds to a via pattern.

It should be noted that the photoresist window 133a is formed in such a manner that a first outer peripheral portion 205, covering a sidewall face on the outer peripheral side of a Cu film 191 being the wiring pattern 171, on a scribe line side 80 of a Ta film 181 being a barrier metal film, and a second outer peripheral portion 206, covering a sidewall face on the outer peripheral side of a via contact portion, of a Ta film 182, are in positional relationship to vertically align with each other.

Step of Etching for Forming Via Pattern

Figure 18B:
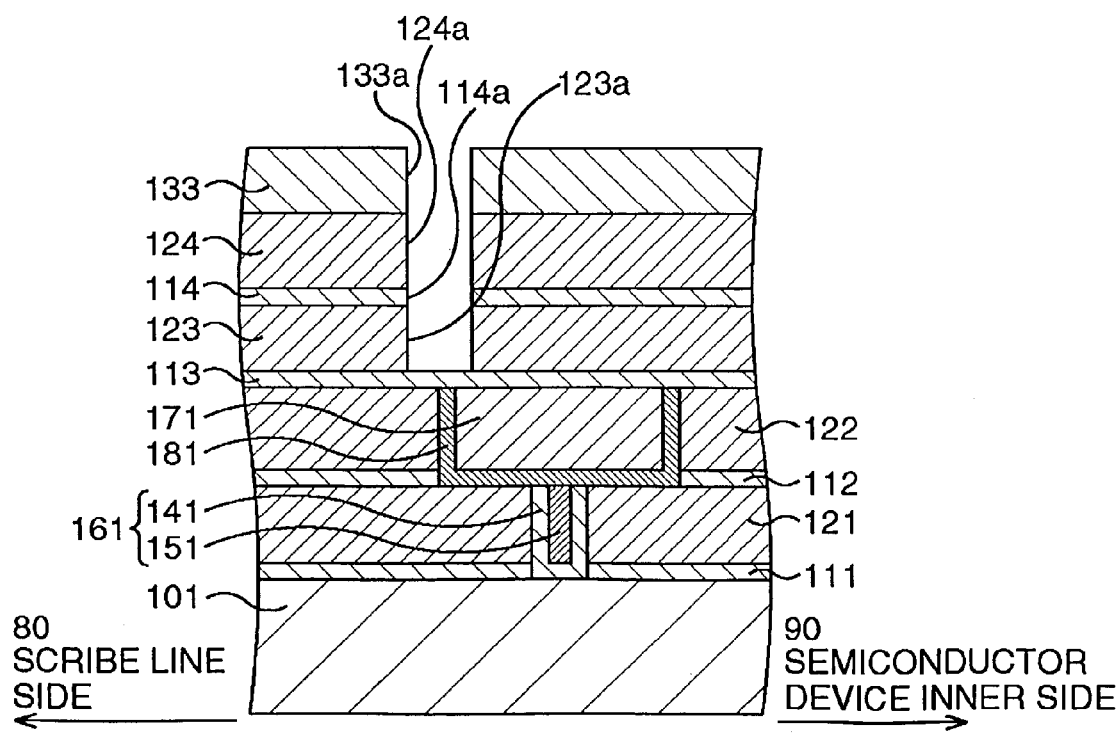

Next, etching is performed with the photoresist film 133 as a mask to form an opening 124a, an opening 114a, and an opening 123a as shown in FIG. 18B.

Steps of Patterning and Etching Resist Film for Forming Wiring

Figure 19A:
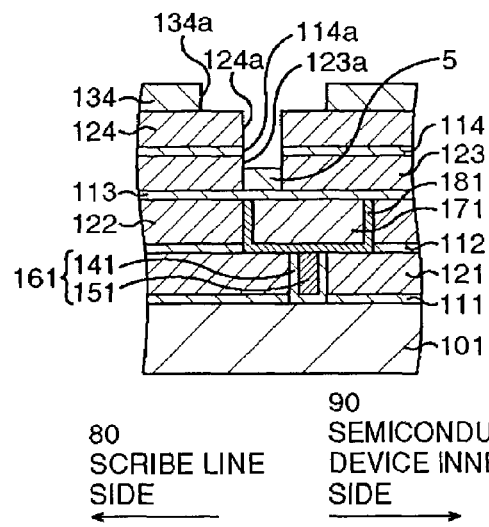
FIGS. 19A to 19C are views (second) showing the manufacturing process of the semiconductor device according to the third embodiment of the present invention.

In the step of FIG. 19A, a nonphotosensitive resin is applied to the surface above the semiconductor substrate and dissolved from its surface to leave a nonphotosensitive resin filler 5 only in the opening 123a which is formed on the silicon nitride film 113. On the silicon oxide film 124, a photoresist film 134 is then applied, exposed to light, and further developed to form a resist window 134a which corresponds to a wiring pattern desired to be formed.

Figure 19B:
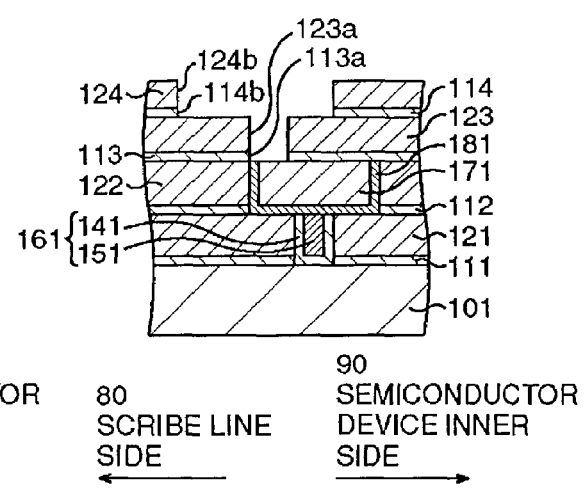

Next, in the step of FIG. 19B, patterning is performed in a desired shape of wiring pattern for formation of an opening 124b in the silicon oxide film 124.

Next, ashing is performed to remove the photoresist film 134 and the nonphotosensitive resin filler 5.

Next, etching is performed with the silicon oxide film 124 as a mask to transfer the shape of the opening 124b to the silicon nitride film 114 for formation of an opening 114b in the silicon nitride film 114.

Concurrently with this, the silicon nitride film 113 is etched with the silicon oxide film 123 as a mask. As a result, the shape of the opening 123a is transferred to the silicon nitride film 113 to form the opening 113a.

Step of Forming Metal Film for Forming Via Pattern and Wiring

Figure 19C:
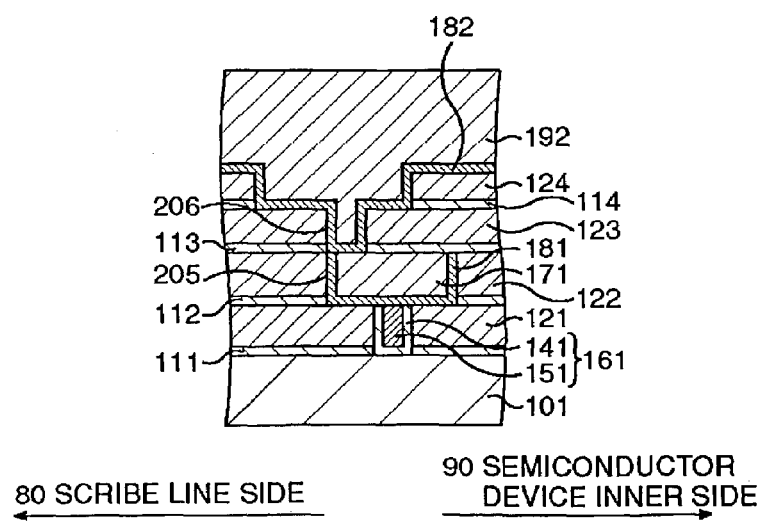

Next, as shown in FIG. 19C, the Ta film 182, as a barrier metal film, is formed to have a thickness of 30 nm inside the opening 124b, the opening 114b, the opening 123a, and the opening 113a, and on the silicon oxide film 124. A Cu film 192, as a wiring material, is subsequently formed to have a thickness of 1600 nm by the sputtering or electrolytic plating method.

CMP Step for Forming Via Pattern and Wiring

Figure 20:
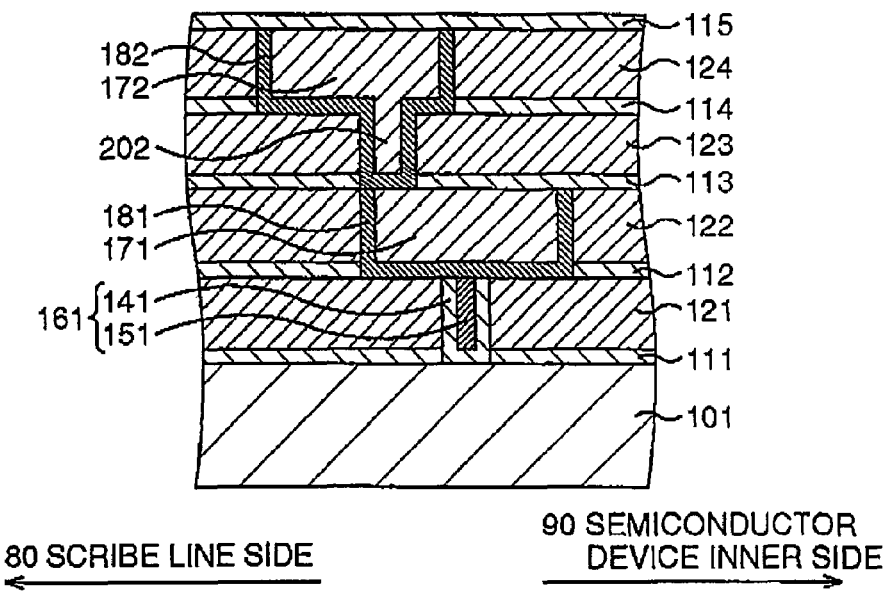
FIG. 20 is a view (third) showing the manufacturing process of the semiconductor device according to the third embodiment of the present invention.

Thereafter, as shown in FIG. 20, the Ta film 182 and the Cu film (not shown) are polished using the CMP method to form the wiring pattern 172.

Also in a moisture-proof ring according to this embodiment, as in the semiconductor device of the second embodiment, the bottom portion of the Ta film 182 constituting the barrier metal film of the via pattern 202 is in contact with the Ta film 181 covering the wiring pattern 171 at the upper end portion of the outer peripheral portion covering the sidewall face on the outer peripheral side of the wiring pattern 171. As a result, the sidewall face on the outer peripheral side of the wiring pattern 171 is continuously covered with the Ta films 181 and 182. Further, in such a structure, the formed interface is a Ta film/Ta film interface or a Ta film/Cu film interface, which can realize excellent adhesiveness.

In addition, even such a structure can effectively intercept moisture or the like which enters along the interface between the silicon oxide film 122 and the silicon nitride film 113 or the interface between the silicon oxide film 123 and the silicon nitride film 114.

Fourth Embodiment

Figure 21:
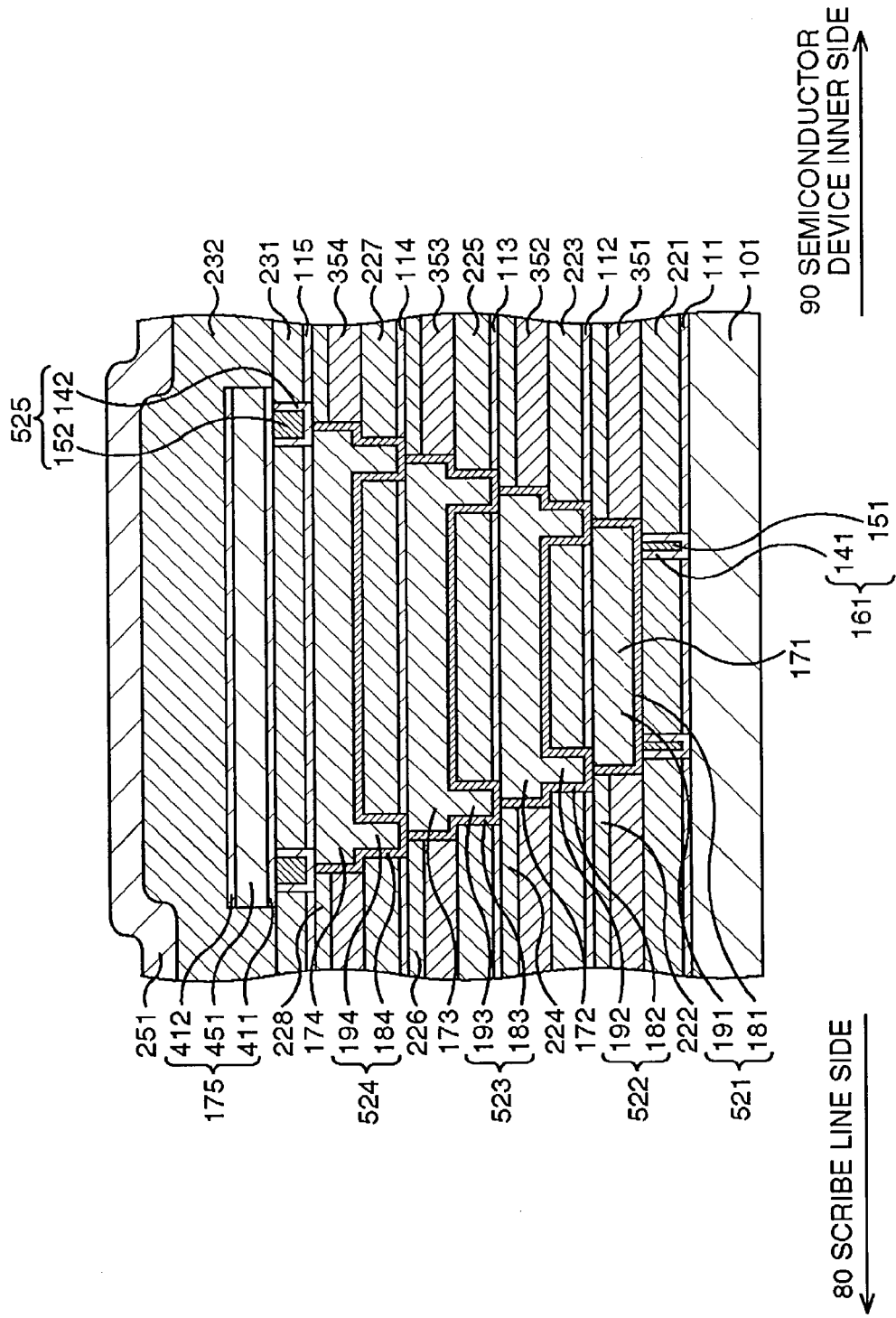
FIG. 21 is a view showing a manufacturing process of a semiconductor device according to a fourth embodiment of the present invention.

FIG. 21 shows a configuration of a semiconductor device according to a fourth embodiment of the present invention. In the drawings, the corresponding reference numbers are assigned to the previously described portions, and the description thereof is omitted.

As shown in FIG. 21, in the semiconductor device according to this embodiment, after formation of a not-shown circuit element on a semiconductor substrate 101, a silicon nitride film 111 and a silicon oxide film 221 are formed to have thicknesses of 100 nm and 900 nm, respectively. The silicon oxide film 221 is then polished by the CMP method, thereby flattening the circuit element portion.

The thickness of the silicon oxide film 221 is reduced to 600 nm by the CMP method. On the silicon oxide film 221, a photoresist film (not shown) is then applied, exposed to light, and further developed to form resist windows (not shown) which correspond to contact patterns. Further, the silicon nitride film 111 and the silicon oxide film 221 are etched with the resist pattern (not shown) as a mask to form contact holes (not shown).

Next, a TiN film 141, as an adhesive layer, is formed to have a thickness of 50 nm inside contact holes 161 and on the silicon oxide film 221. A tungsten film 151 is subsequently formed to have a thickness of 400 nm. The tungsten film 151 and the TiN film 141 are then polished using the CMP method to form inside the contact holes 161 contact patterns composed of the tungsten film 151 and the TiN film 141.

Next, an organic SOG film 351 and a silicon oxide film 222 are formed on the contact patterns. Further, on the silicon oxide film 222, a photoresist film (not shown) for wiring processing of a wiring pattern 171 is applied, exposed to light, and further developed to form a resist window (not shown) which corresponds to the wiring pattern 171. Thereafter, the silicon oxide film 222 and the organic SOG film 351 are etched to process a groove for the wiring pattern 171.

For the etching of the silicon oxide film 222, the plasma etching method using $C_4F_8$ gas, CO gas, $O_2$ gas, Ar gas, or the like is used. The etching of the organic SOG film 351 is performed in an atmosphere with $O_2$ gas, Ar gas, $H_2$ gas, or the like introduced.

Next, in the groove for forming the wiring pattern 171 and on the silicon oxide film 222, a Ta film 181, as a barrier metal film, is formed to have a film thickness of 30 nm. A Cu film 191, as a wiring material, is subsequently formed to have a thickness of 1600 nm by the sputtering or electrolytic plating method. Thereafter, the Ta film 181 and the Cu film 191 are polished using the CMP method to remain only in the wiring pattern 171. The remaining Ta film 181 and Cu film 191 are used as the wiring pattern 171.

Next, a silicon nitride film 112 is formed to have a thickness of 70 nm on the wiring pattern 171 and on the silicon oxide film 222.

Next, a silicon oxide film 223, an organic SOG film 352, a silicon oxide film 224, and a metal film (for example, a TiN film or the like, not shown) are formed on the silicon nitride film 112. Further, on the metal film, another photoresist film (not shown) for wiring processing of a wiring pattern 172 is applied, exposed to light, and further developed to form a resist window (not shown) which corresponds to the not-shown wiring pattern 172.

Thereafter, the metal film is etched with the photoresist film (not shown) as a mask to transfer the opening for the wiring pattern 172 to the metal film. Ashing is then performed to remove the photoresist film (not shown).

Subsequently, on the metal film and the silicon oxide film 224, another photoresist film (not shown) is applied, exposed to light, and further developed to form photoresist windows (not shown) which correspond to via patterns 522. In this event, the photoresist windows (not shown) are formed at positions included inside the wiring pattern 172.

Next, the via patterns are transferred to the silicon oxide film 224 with the photoresist film (not shown) as a mask. The organic SOG film 352 is etched with the silicon oxide film 224 as a mask, and the photoresist film is concurrently removed.

Subsequently, the silicon oxide film 224 and the silicon oxide film 223 are concurrently etched with the wiring pattern 172 transferred to the metal film and the via patterns transferred to the organic SOG film 352 as masks. The etching is performed until the top of the organic SOG film 352 and the top of the silicon nitride film 112 are exposed. The organic SOG film 352 is then selectively etched with the silicon oxide film 224 as a mask, and finally the silicon nitride film 112 is removed by etching with the silicon oxide film 223 as a mask for formation of openings for portions connecting with the wiring pattern 171.

Next, in the openings for the via patterns 522 and the wiring pattern 172, a Ta film 182, as a barrier metal film, is formed to have a thickness of 30 nm. A Cu film 192, as a wiring material, is subsequently formed to have a thickness of 1600 nm by the sputtering or electrolytic plating method. Thereafter, the metal film (not shown) used for transferring the wiring pattern, the Ta film 182, and the Cu film 192 are polished using the CMP method to leave, only inside the via patterns 522 and the wiring pattern 172, the Ta film 182 and the Cu film 192 which are used as the via patterns 522 and the wiring pattern 172.

Next, on the wiring pattern 172 and on the silicon oxide film 224, a silicon nitride film 113 is formed to have a thickness of 70 nm. Thereafter, a silicon oxide film 225, an organic SOG film 353, and a silicon oxide film 226 are formed, and via patterns 523 and a wiring pattern 173 are formed inside the silicon nitride film 113, the silicon oxide film 225, the organic SOG film 353, and the silicon oxide film 226. It should be noted that the method for forming the via patterns 523 and the wiring pattern 173 is the same as the forming procedure of the via patterns 522 and the wiring pattern 172, and thus the description thereof is omitted. Via patterns 524 and a wiring pattern 174 to be formed above the wiring pattern 173 are formed by the same procedure, and thus the description of the forming method thereof is omitted.

Next, the description will be made after the formation of the wiring pattern 174. After the formation of the wiring pattern 174, on the wiring pattern 174 and on a silicon oxide film 228, a silicon nitride film 115 is formed to be 70 nm. Thereafter, on the silicon nitride film 115, a silicon oxide film 231 is formed.

Next, on the silicon oxide film 231, another photoresist film (not shown) is applied, exposed to light, and further developed to form photoresist windows (not shown) which correspond to via patterns 525. In this event, the positions of the photoresist windows (not shown) are set so that outer peripheral portions, covering sidewall faces on the outer peripheral sides of a Cu film 194 being a wiring material, of a Ta film 184 being a barrier metal film, are included in the resist windows (not shown) corresponding to the via patterns 525.

Thereafter, the silicon oxide film 231 and the silicon nitride film 115 are etched with the photoresist film (not shown) as a mask to transfer the windows for the via patterns 525 to the silicon oxide film 231 and the silicon nitride film 115 for formation of openings for via patterns.

Next, a TiN film 142 and a tungsten film 152 are formed in the via patterns 525 and on the silicon oxide film 231. The tungsten film 152 and the TiN film 142 are polished using the CMP method to remain only inside the via patterns 525. The remaining tungsten film 152 and TiN film 142 are used as the via patterns 525.

On and above the via patterns 525, a TiN/Ti film 411, an Al—Cu film 451, and a TiN/Ti film 412 are formed. On the TiN/Ti film 412, another photoresist film (not shown) is then applied, exposed to light, and further developed into the shape of a wiring pattern 175, thus patterning the photoresist film (not shown).

Next, etching is performed with the photoresist film (not shown) as a mask to form the wiring pattern 175. A silicon oxide film 232 is then formed, and finally a protective film 251 of SiN or the like is formed on the silicon oxide film 232 by the plasma CVD method. This permits the silicon oxide film 232 and the protective film 251 to be formed in a surface shape after the wiring pattern 175.

In the case of this embodiment, a joint surface between the contact pattern and the wiring pattern 171 is formed of the metal film TiN and Ta that is also a metal film, and thus has a structure with strong adhesiveness and moistureproofness. The structure from the wiring pattern 171 to the wiring pattern 174 is a structure with strong adhesiveness and moistureproofness because the Ta films are continuously formed when seen in a direction of thickness from the semiconductor substrate 101. Further, the wiring pattern 174 and the via pattern 525 are formed of the metal film Ta and TiN that is also a metal film, and thus have a structure with strong adhesiveness and moistureproofness.

Accordingly, the structure of a moisture-proof ring of this embodiment can prevent cracks in dicing and intercept moisture or the like which enters, thus improving the reliability of the semiconductor device.

Fifth Embodiment

Figure 22:
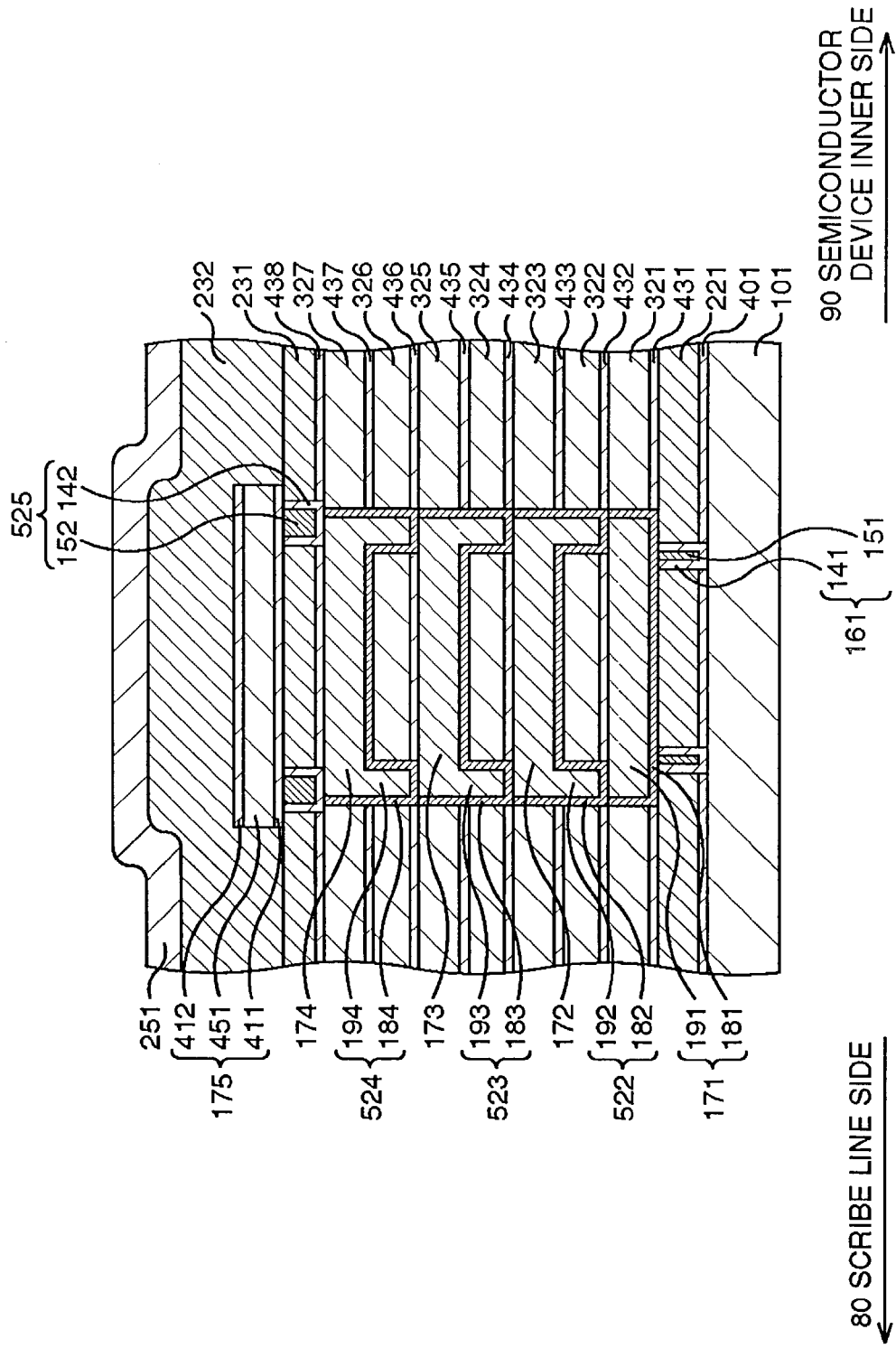
FIG. 22 is a view showing a manufacturing process of a semiconductor device according to a fifth embodiment of the present invention.

FIG. 22 shows a configuration of a semiconductor device according to a fifth embodiment of the present invention. In FIG. 22, the same reference numbers are assigned to portions corresponding to the previously described portions, and the description thereof is omitted.

Referring to FIG. 22, after formation of a not-shown circuit element on a semiconductor substrate 101, a silicon nitride film 401 and a silicon oxide film 221 are formed to have thicknesses of 100 nm and 900 nm, respectively. To flatten the circuit element portion, the silicon oxide film 221 is polished using the CMP method so that the silicon oxide film 221 is formed to have a thickness of 600 nm. On the silicon oxide film 221, a photoresist film is then applied, exposed to light, and further developed to form photoresist windows which correspond to contact patterns. The silicon nitride film 401 and the silicon oxide film 221 are then etched to form contact holes 161.

Next, a TiN film 141, as an adhesive layer, is formed to have a thickness of 50 nm inside the contact holes 161 and on the silicon oxide film 221. A tungsten film 151 is subsequently formed to have a thickness of 400 nm. The tungsten film 151 and the TiN film 141 are polished using the CMP method. As a result, only inside the contact holes 161, the tungsten film 151 and the TiN film 141 remain and are used as contact patterns.

Next, a SiC film 431 and a SIOC film 321 are formed on the silicon oxide film 221 including the contact patterns 161.

On the SIOC film 321, a photoresist film (not shown) for wiring processing of a wiring pattern 171 is then applied, exposed to light, and further developed to form a window (not shown) for the wiring pattern 171. Next, the SIOC film 321 and the SiC film 431 are etched with the photoresist film (not shown) as a mask to process a groove (not shown) for the wiring pattern 171 for establishing conduction with the contact patterns.

Next, on the wiring pattern 171 and on the SiOC film 321, a Ta film 181, as a barrier metal film, is formed to have a film thickness of 30 nm. A Cu film 191, as a wiring material, is subsequently formed to have a thickness of 1600 nm by the sputtering or electrolytic plating method.

Thereafter, the Ta film 181 and the Cu film 191 are polished using the CMP method to remain only inside the wiring pattern 171. The remaining Ta film 181 and Cu film 191 are used as the wiring pattern 171.

Next, a SiC film 432, a SiOC film 322, a SiC film 433, and a SIOC film 323 are formed on the wiring pattern 171 and on the SIOC film 321.

Next, on the SIOC film 323, another photoresist film (not shown) is applied, exposed to light, and further developed to form windows (not shown) for via patterns 522 so that outer peripheral portions, covering sidewall faces on the outer peripheral sides of a Cu film 192 of the via patterns 522, of a Ta film 182 being the barrier metal of a wiring pattern 172, and outer peripheral portions, covering sidewall faces on the outer peripheral sides of the Cu film 191, of the Ta film 181 being the barrier metal of the wiring pattern 171, are in positional relationship to vertically align with each other.

Next, the SIOC film 323, the SiC film 433, and the SiOC film 322 are etched with the photoresist film (not shown) as a mask to transfer the windows for the via patterns 522 to the SIOC film 323, the SiC film 433, and the SiOC film 322 for formation of openings (not shown).

Next, a nonphotosensitive resin is applied to the surface above the semiconductor substrate and dissolved from its surface to leave nonphotosensitive resin fillers (not shown) only in the openings.

Next, on the SIOC film 323, another photoresist film (not shown) is applied, exposed to light, and further developed to form a window (not shown) for the wiring pattern 172 in such a manner that outer peripheral portions, covering sidewall faces on the outer peripheral sides of the Cu film 192 of the wiring pattern 172, of the Ta film 182 being the barrier metal of the wiring pattern 172, and the outer peripheral portions, covering the sidewall faces on the outer peripheral sides of the Cu film 191, of the Ta film 181 being the barrier metal of the wiring pattern 171, are in positional relationship to vertically align with each other.

Next, the SIOC film 323 is etched with the photoresist film (not shown) as a mask to transfer the window (not shown) for the wiring pattern 172 to the SIOC film 323 for formation of an opening (not shown).

Next, ashing is performed to remove the photoresist film (not shown) and the nonphotosensitive resin fillers (not shown).

Next, the SiC film 433 at the bottom of the wiring pattern 172 and the SiC film 432 at the bottom of the via patterns 522 are etched while the conditions of the etching are changed. The Ta film 182, as a barrier metal film, is then formed to have a thickness of 30 nm inside the via patterns 522, inside the wiring pattern 172, and on the SIOC film 323. The Cu film 192, as a wiring material, is subsequently formed to have a thickness of 1600 nm by the sputtering or electrolytic plating method. The Ta film 182 and the Cu film 192 are then polished using the CMP method to remain only inside the via patterns 522 and inside the wiring pattern 172. The remaining Ta film 182 and Cu film 192 are used as the via patterns 522 and the wiring pattern 172.

Next, a SiC film 434 is formed on the wiring pattern 172 and the SIOC film 323.

Thereafter, a SiOC film 324, a SiC film 435, and a SIOC film 325 are formed on the SiC film 434. Via patterns 523 and a wiring pattern 173 are formed inside the SIOC film 325, the SiC film 435, the SIOC film 324, and the SiC film 434 by photolithography and etching. A Ta film 183 and a Cu film 193 are then formed and left only inside the via patterns 523 and inside the wiring pattern 173 by the CMP method. The remaining Ta film 183 and Cu film 193 are used as the via patterns 523 and the wiring pattern 173.

It should be noted that the method for forming the via patterns 523 and the wiring pattern 173 is the same as the forming procedure of the via patterns 522 and the wiring pattern 172, and thus the description thereof is omitted. Via patterns 524 and a wiring pattern 174 to be formed above the wiring pattern 173 are formed by the same procedure, and thus the description of the forming method thereof is omitted.

Next, the description will be made after the formation of the wiring pattern 174. After the formation of the wiring pattern 174, on the wiring pattern 174 and on a SiOC film 327, a SiC film 438 and a silicon oxide film 231 are formed.

Next, on the silicon oxide film 231, another photoresist film (not shown) is applied, exposed to light, and further developed to form windows (not shown) for via patterns 525.

The windows (not shown) for the via patterns 525 are formed so that outer peripheral portions, covering sidewall faces on the outer peripheral sides of a Cu film 194 being a wiring material, of a Ta film 184 being a barrier metal film, are included in the windows (not shown) for the via patterns 525.

Thereafter, the silicon oxide film 231 and the SiC film 438 are etched with the photoresist film (not shown) as a mask to transfer the windows (not shown) for the via patterns 525 to the silicon oxide film 231 and the SiC film 438 for formation of openings (not shown) for the via patterns 525.

Next, a TiN film 142 and a tungsten film 152 are formed in the via patterns 525 and on the silicon oxide film 231. The tungsten film 152 and the TiN film 142 are polished using the CMP method to remain only inside the via patterns 525. The remaining tungsten film 152 and TiN film 142 are used as the via patterns 525.

Next, on the via patterns 525, a TiN/Ti film 411, an Al—Cu film 451, and a TiN/Ti film 412 are formed. On the TiN/Ti film 412, another photoresist film (not shown) is then applied, exposed to light, and further developed into the shape of a wiring pattern 175 to form a window (not shown) for the wiring pattern 175.

Next, etching is performed with the photoresist film (not shown) as a mask to form the wiring pattern 175. A silicon oxide film 232 is then formed, and finally a protective film 251 of SiN or the like is formed on the silicon oxide film 232 by the plasma CVD method. This permits the silicon oxide film 232 and the protective film 251 to be formed in a surface shape after the wiring pattern 175.

Also in the case of this embodiment, as in the fourth embodiment, a joint surface between the contact pattern and the wiring pattern 171 is formed of the metal film TiN and Ta that is also a metal film, and thus has a structure with strong adhesiveness and moistureproofness. The structure from the wiring pattern 171 to the wiring pattern 174 is a structure with strong adhesiveness and moistureproofness because the Ta films are continuously formed when seen in a direction of thickness from the semiconductor substrate 101. Further, the wiring pattern 174 and the via pattern 525 are formed of the metal film Ta and TiN that is also a metal film, and thus have a structure with strong adhesiveness and moistureproofness.

Accordingly, the structure of a moisture-proof ring-of this embodiment can prevent cracks in dicing and intercept moisture or the like which enters, thus improving the reliability of the semiconductor device.

Sixth Embodiment

The above embodiments are for forming moisture-proof rings by the dual damascene method, and the present invention is also applicable to a process using a single damascene method.

Figure 23:
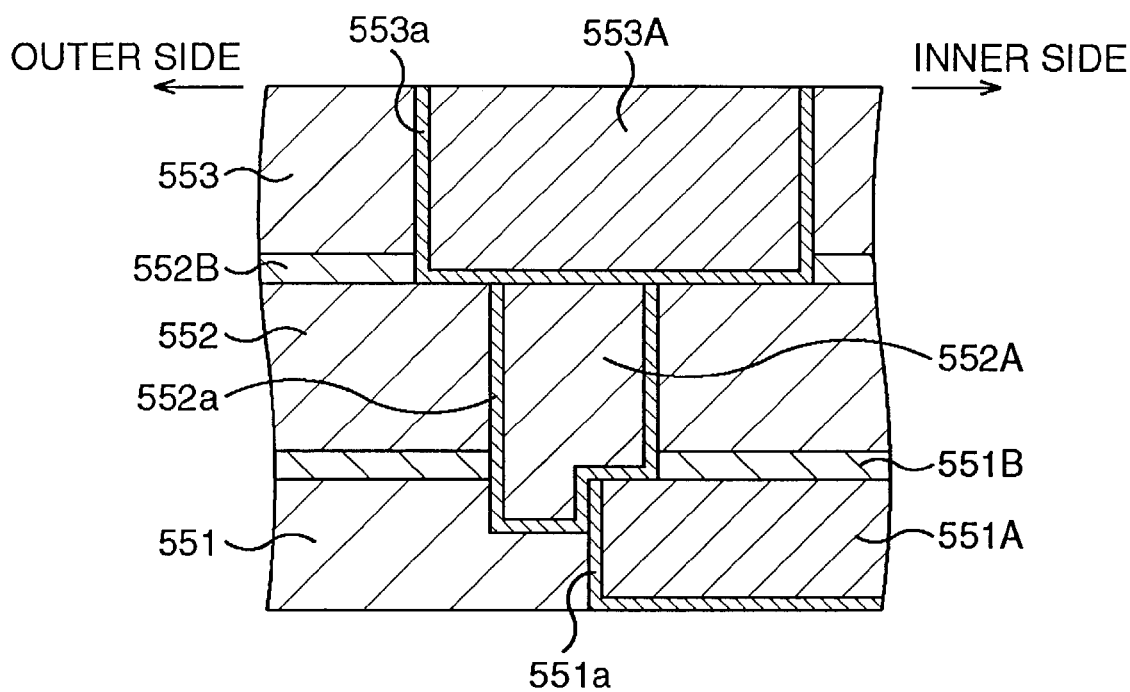
FIG. 23 is a view showing a manufacturing process of a semiconductor device according to a sixth embodiment of the present invention.

FIG. 23 shows a cross-sectional structure of a moisture-proof ring according to a sixth embodiment of the present invention.

Referring to FIG. 23, a conductor pattern 551A is formed in an interlayer insulation film 551. An interlayer insulation film 552 is formed above the interlayer insulation film 551 with an etching stopper film 551B intervening therebetween. In the interlayer insulation film 552, a via plug 552A is formed in a via hole. A portion of the via plug 552A enters the interlayer insulation film 551 to come into contact with the conductor pattern 551A.

The sidewall faces and the bottom face of the via plug 552A are continuously covered with a barrier metal film 552a such as Ta, TaN, Ti/TiN. The sidewall face and the bottom face of the conductor pattern 551A are also covered with a similar barrier metal film 551a.

In the structure shown in the drawing, the entry path of moisture along the interface between the interlayer insulation film 551 and the etching stopper film 551B is intercepted by the barrier metal film 551a and the barrier metal film 552a as in the forgoing embodiments.

On the other hand, another interlayer insulation film 553 is formed above the interlayer insulation film 552 with an etching stopper film 552B intervening therebetween. In the interlayer insulation film 553, a conductor pattern 553A is formed while its sidewall faces and bottom face are continuously covered with a barrier metal film 553a. Such a structure results from formation of the via plug 552A in the interlayer insulation film 552 by the single damascene method before formation of the interlayer insulation film 553 and the conductor pattern 553A by the same single damascene method.

In this event, the conductor pattern 553A is formed at a position on the outside of the position where the via plug 552A is formed in this embodiment. As a result, the barrier metal film 553a covering the sidewall faces and bottom face of the conductor pattern 553A is in contact with the barrier metal film 552a covering the sidewall faces of via plug 552A, at the interface between the interlayer insulation film 552 and the etching stopper film 552B. This results in interception of moisture entry along the interface between the interlayer insulation film 552 and the etching stopper film 552B.

In this embodiment, the conductor pattern 553A may be formed at a position where the barrier metal film 553a covering the outer sidewall face of the conductor pattern 553A aligns with the barrier metal film 552a covering the outer sidewall face of the via plug 552A.

It should be noted that the structures shown in FIG. 15B, FIG. 16B, FIG. 17. FIG. 20. FIGS. 21 to 23 are not limited to a moisture-proof ring, but are also applicable to a multilayer wiring structure of an internal circuit.

Further, the structures shown in FIG. 15B, FIG. 16B, FIG. 17. FIG. 20. FIGS. 21 to 23 are also usable for a moisture-proof ring of a fuse portion formed in a chip. However, this case employs a pattern in a structure in which the patterns on the outer peripheral side and the inner peripheral side in the drawing are inverted.

Seventh Embodiment

The structures in which the moisture-proof ring is provided on the outer periphery of the semiconductor circuit region are illustrated in the above embodiments. The technical idea of the present invention, however, is not limited to this. It is also possible to provide a similar structure also in the semiconductor circuit region and secure moistureproofness, against moisture or the like which enters from the surface side of the circuit region. A specific example thereof is described hereafter as a seventh embodiment of the present invention.

Figure 24A:
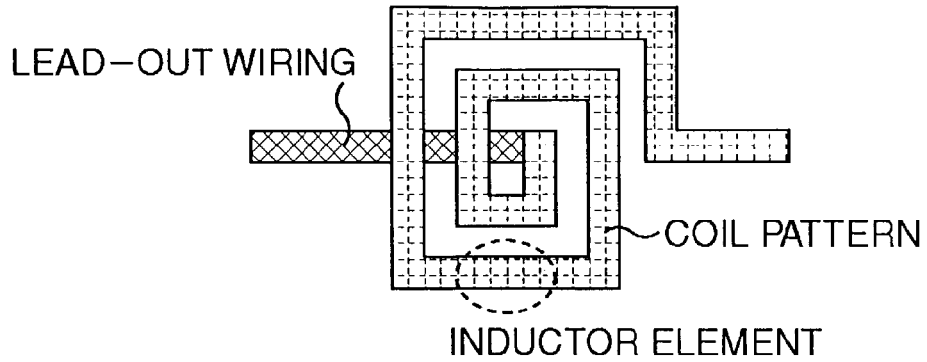
FIGS. 24A to 24C are views showing a configuration example of an inductor element formed in a semiconductor circuit region.

FIG. 24A is a plane view showing a configuration example of an inductor element formed in the semiconductor circuit region. In the inductor element in the example of FIG. 24A, a wiring pattern continuously extending in a coil form is formed, and a lead-out wiring is formed which is connected with an end portion of the wiring pattern at a lower layer of the wiring pattern.

Figure 24B:
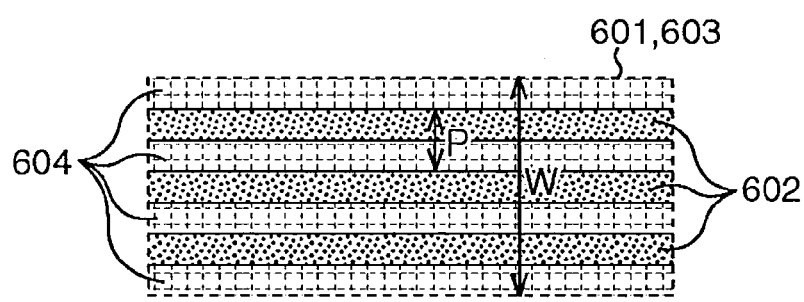
Figure 24C:
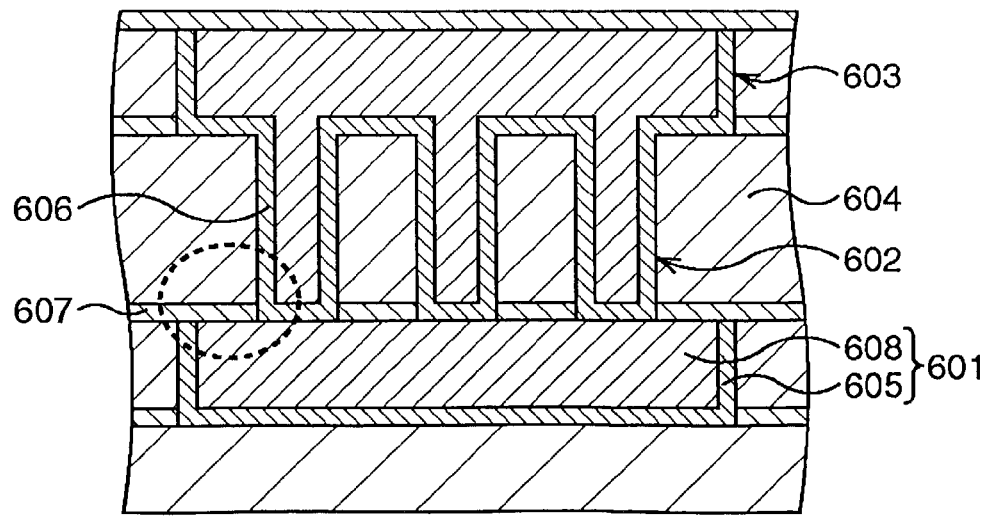

FIG. 24B and FIG. 24C are an enlarged plane view and an enlarged cross-sectional view of a portion within a broken line in FIG. 24A. As shown in FIG. 24C, in this inductor element, an upper layer wiring pattern 603 and via patterns 602 are formed by the dual damascene method. Further, this inductor element has such a structure that the via patterns 602 are sufficiently included in a lower layer wiring pattern 601, as shown in FIG. 24B and the portion within the broken line in FIG. 24C, and, for example, the bottom face portion of a barrier metal film 606 such as a Ta film or the like covering the via patterns 602 is not in contact with, for example, the upper end portion of a barrier metal film 605 such as a Ta film or the like covering the lower layer wiring pattern 601 as in the portion within the broken line in FIG. 24C.

Figure 25A:
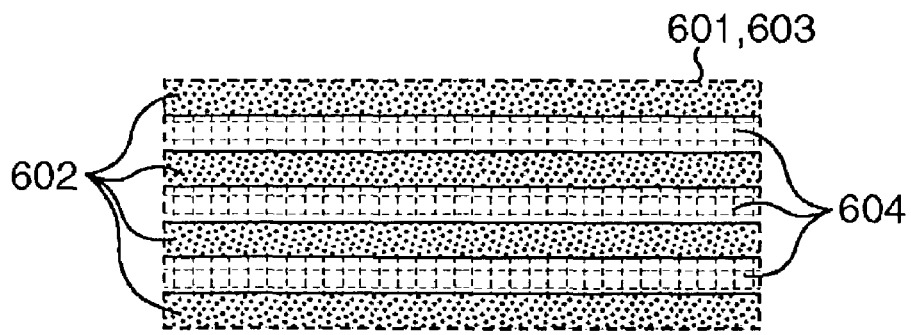
FIGS. 25A and 25B are views showing a configuration of an inductor element according to a seventh embodiment of the present invention.
Figure 25B:
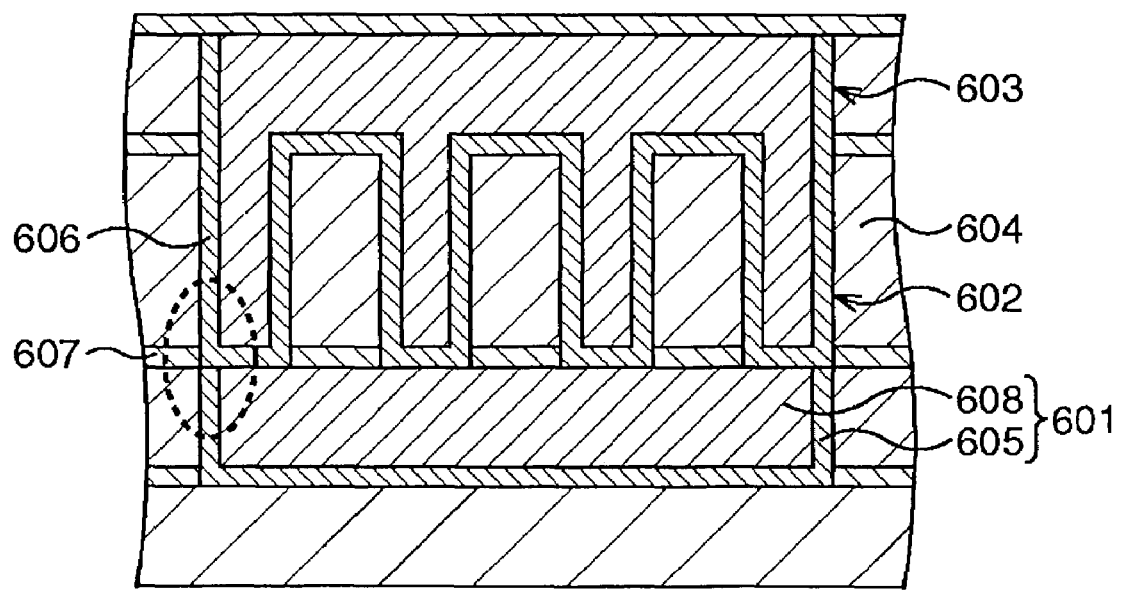

FIGS. 25A and 25B are views showing a plane structure and a cross-sectional structure of an inductor element according to the seventh embodiment of the present invention.

As shown in FIG. 25B, in the inductor element of this embodiment, an upper layer wiring pattern 603 and via patterns 602 are formed by the dual damascene method similarly to the inductor element shown in FIGS. 24A to 24C. This inductor, however, has such a configuration that the bottom face portions of a barrier metal film 606 covering the side faces of the via patterns 602 are in contact with the upper end portions of a barrier metal film 605 of a lower layer wiring pattern 601 so that the side faces of the barrier metal film 605 and the barrier metal film 606 vertically substantially align with each other.

Letter P in FIG. 24B denotes the pitch of the via patterns 602, and letter W denotes the width of the wiring patterns 601 and 603. In this example, it is assumed that the width W of the wiring patterns 601 and 603 is 10 μm, and the pitch P of the via patterns 602 is 0.6 μm. Further, assuming that the width of the via pattern 602 is 0.3 μm, 16 via patterns 602 can be formed per one wiring pattern in the inductor element in the example of FIG. 24B. In contrast to this, in the inductor element of this embodiment under the same conditions, one side face of the via pattern 602 and one side face of the lower layer wiring pattern 601 are vertically aligned each other as shown in FIG. 25A and FIG. 25B, so that an excessive space of 0.4 μm is produced even when 16 via patterns 602 are formed. This allows one more via pattern 602 to be added and enables the resistance to be reduced at portions of the via patterns 602.

Eighth Embodiment

Figure 26A:
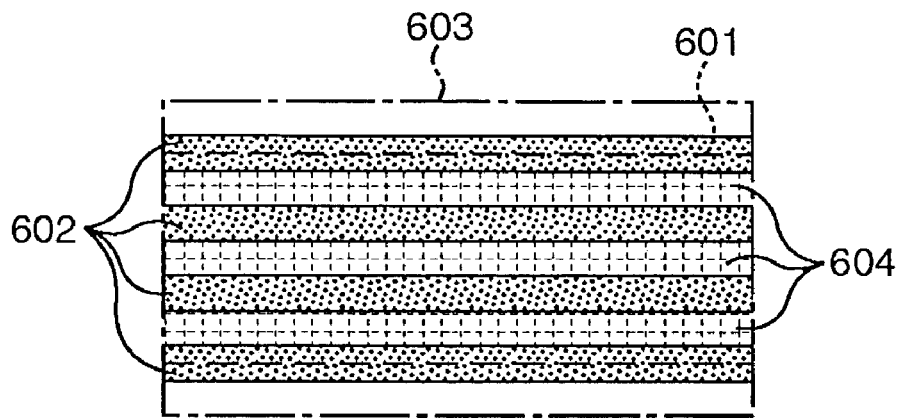
FIGS. 26A and 26B are views showing a configuration of an inductor element according to an eighth embodiment of the present invention.
Figure 26B:
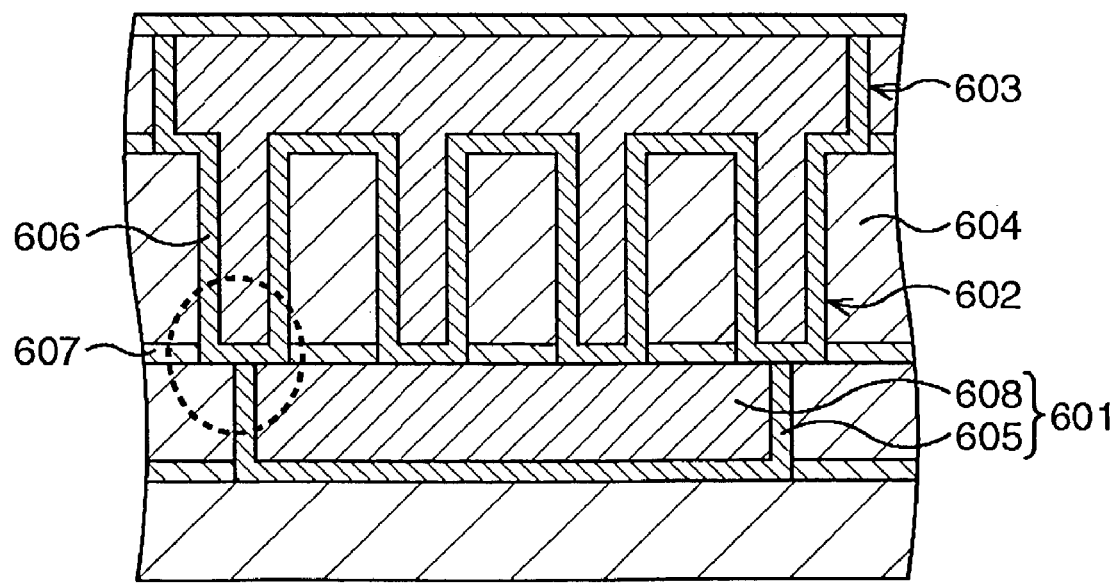

FIGS. 26A and 26B are views showing a plane structure and a cross-sectional structure of an inductor element according to an eighth embodiment of the present invention.

In the above-described seventh embodiment, the example, in which the widths of the lower layer wiring pattern 601 and the upper layer wiring pattern 603 are the same, is described. The wiring structure of this embodiment is formed, as shown in FIG. 26A and FIG. 26B, such that the width of an upper layer wiring pattern 603 is larger than the width of a lower layer wiring pattern 601. Accompanying this, the pitch P of via patterns 602 is increased so that the bottom face portions of the via patterns 602 included in the end portions cover the upper end portions of a barrier metal film 605 and extend to outside the lower layer wiring pattern 601.

Ninth Embodiment

Figure 27:
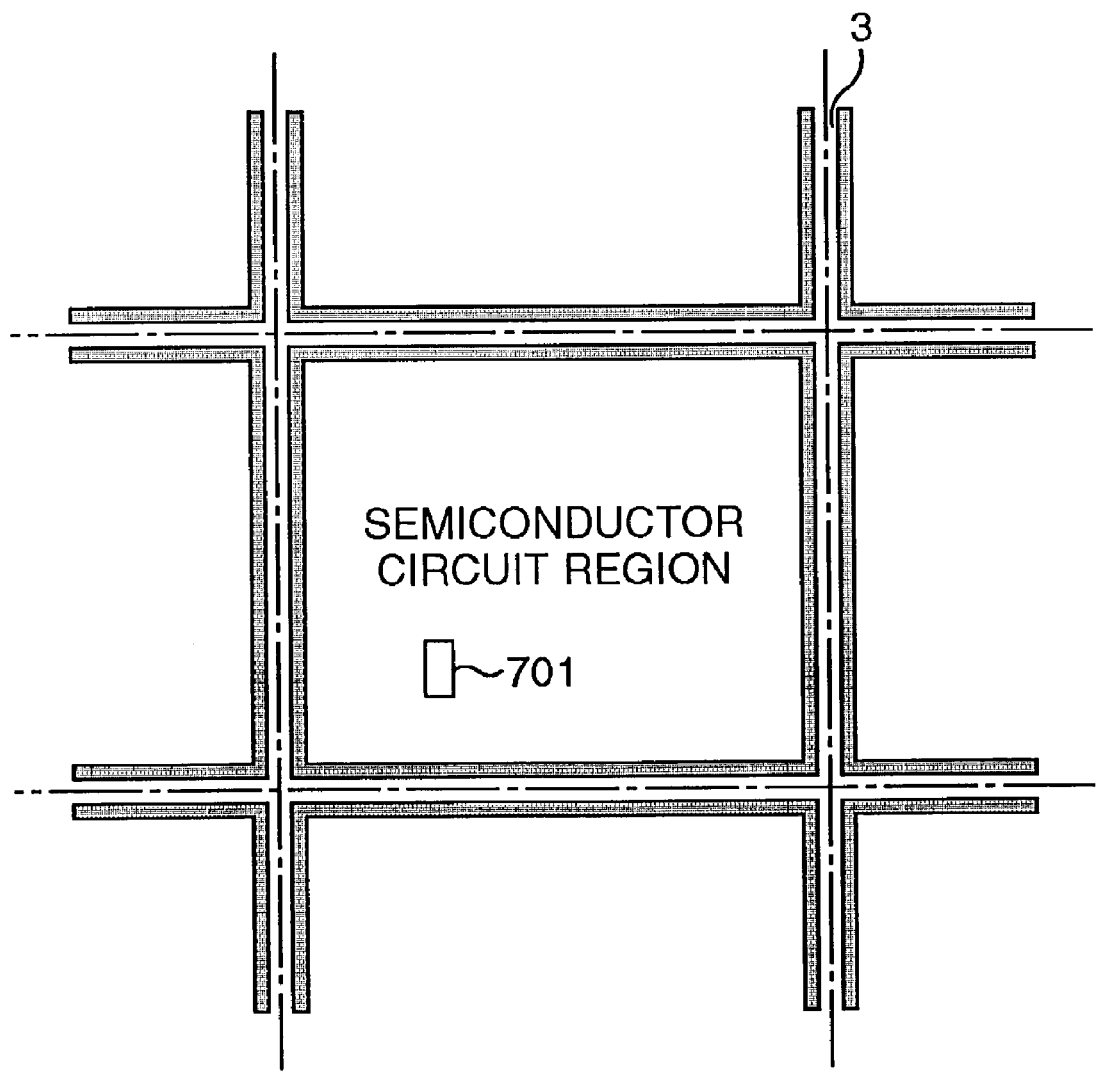
FIG. 27 is a view for explaining the position where the inductor element is formed in a semiconductor circuit region.

Next, a fuse element with a moisture-proof ring structure is described as a ninth embodiment of the present invention. A fuse element 701 that is a redundant circuit element can generally be formed, as shown in FIG. 27, at any position in the semiconductor circuit region similarly to the aforesaid inductor element.

Figure 28A:
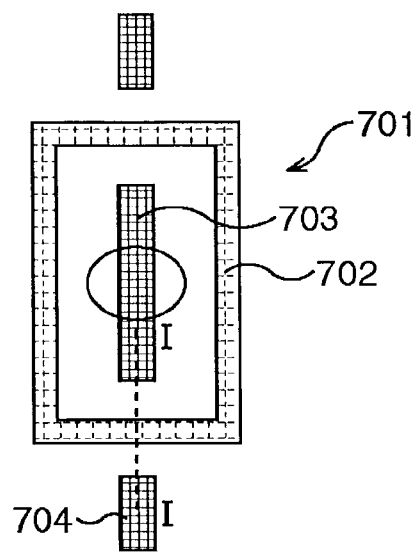
FIGS. 28A and 28B are views showing a configuration of a fuse element according to a ninth embodiment of the present invention.
Figure 28B:
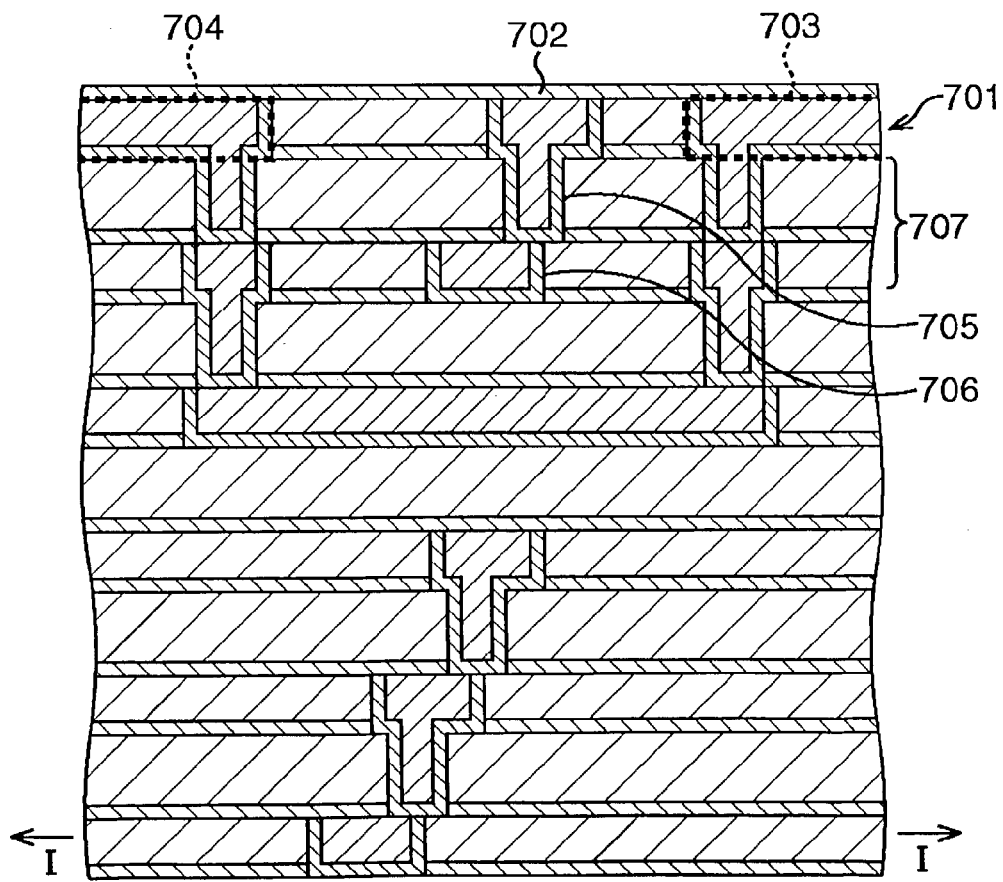

FIG. 28A is a plane view showing a configuration of the fuse element 701 of this embodiment. FIG. 28B is a view showing the configuration of a cross section of a portion taken along a I—I broken line in FIG. 28A. As shown in FIG. 28A and FIG. 28B, the fuse element 701 in this embodiment has a moisture-proof ring structure 702, a cut portion 703, and a lead-out wiring portion 704. The moisture-proof ring structure 702 is formed, as shown in FIG. 28A, along the periphery of the fuse element 701.

This moisture-proof ring structure is placed, as shown in FIG. 28B, in such a manner that a via pattern 705 is offset with respect to a lower wiring pattern 706 toward the side which is to be exposed to the atmospheric air after cutting, that is, the cut portion 703 side of the fuse element 701, that is, the inner side of the semiconductor device. This permits the moisture-proof ring structure 702 to function effectively when an insulation film 707 formed under the cut portion 703 is exposed to the atmospheric air due to the cutting at the cut portion 703, and moisture or the like enters therefrom.

In the above-described first to eighth embodiments, the via pattern is configured to be offset to the outer side with respect to the lower layer wiring pattern, at the outer peripheral portion of the semiconductor device, thereby effectively preventing a disturbance occurring in dicing or the like. In contrast to this, in this embodiment, the via pattern 705 is configured to be offset to the inner side of the semiconductor device with respect to the lower layer wiring pattern 706, thus effectively responding to a disturbance occurring in cutting the fuse element 701. In other words, the technical idea of the present invention includes placement of the via pattern 705 offset, when necessary, in an arbitrary direction with respect to the lower layer wiring pattern 706.

Tenth Embodiment

Figure 29A:
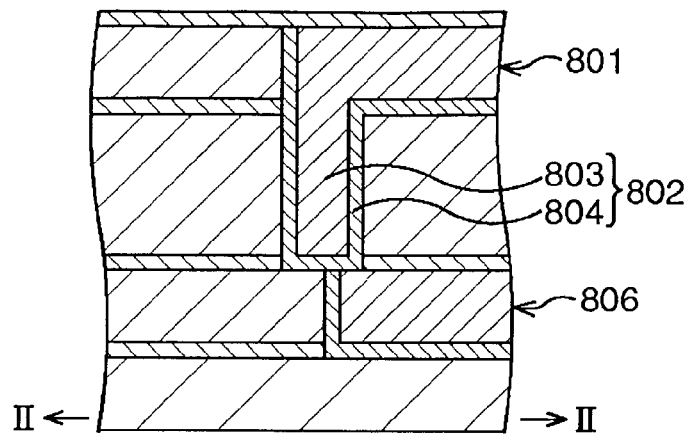
FIGS. 29A to 29C are views for explaining the relation between a via pattern and an upper layer wiring pattern.
Figure 29B:
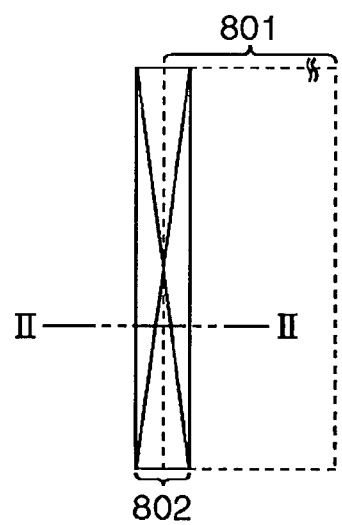
Figure 29C:
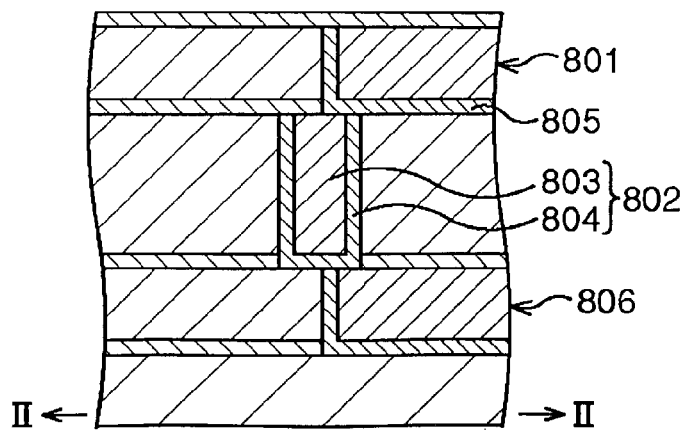

FIGS. 29A to 29C are views for explaining the relation between a via pattern 802 and an upper layer wiring pattern 801. FIG. 29A is a cross-sectional diagram when the via pattern 802 and the upper layer wiring pattern 801 are formed by the dual damascene method. FIG. 29B and FIG. 29C are views of a plane configuration and a cross-sectional configuration when a via pattern and an upper layer wiring pattern are formed by the single damascene method. It should be noted that a one-dotted chain line II—II in FIG. 29B is a line showing the cross section in FIG. 29C.

Here, the via pattern 802 and the upper layer wiring pattern 801 present no problem when they are formed by the dual damascene method as shown in FIG. 29A, because the via pattern 802 is formed in a self-alignment manner at a position included in the upper layer wiring pattern 801. However, the via pattern 802 and the upper layer wiring pattern 801 present the following problems when they are formed by the single damascene method.

More specifically, when a via pattern is formed offset in an arbitrary direction with respect to a lower layer wiring pattern, and an upper layer wiring pattern is formed in the same pattern as that of the lower layer wiring pattern, such a structure is created in which only a portion of the top face of the via pattern 802 is in contact with the upper layer wiring pattern 801 as shown in FIG. 29B and FIG. 29C. As has been described, the adhesiveness between an etching stopper film 805 such as a SiN film or the like and a barrier metal film 804 such as a Ta film or the like and the adhesiveness between the etching stopper film 805 such as a SiN film or the like and a wiring 803 such as a Cu film or the like are poor respectively, thus giving rise to a problem that the Cu wiring is corroded due to entry of moisture or the like.

Figure 30A:
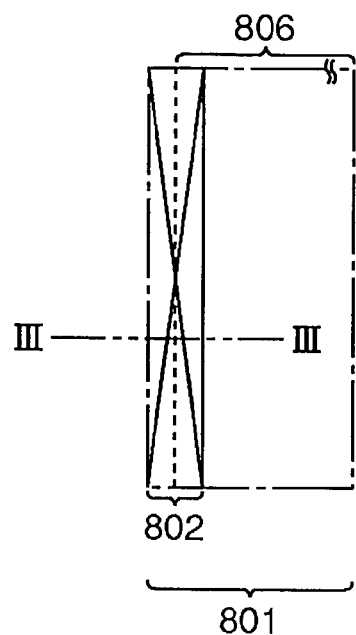
FIGS. 30A and 30B are views showing a wiring structure in a tenth embodiment of the present invention.
Figure 30B:
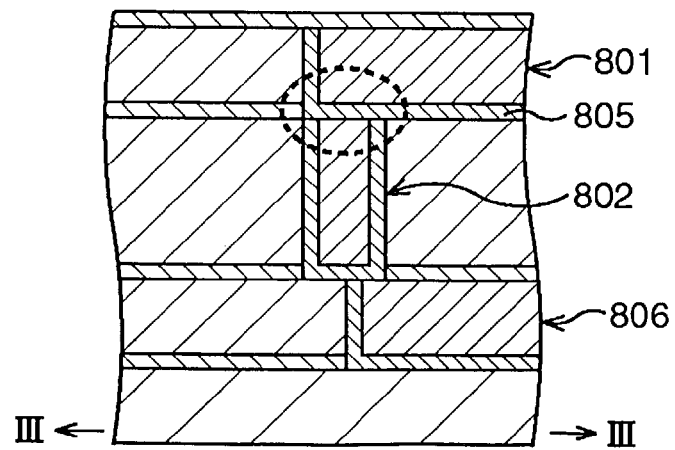

FIGS. 30A and 30B are views showing a wiring structure in a tenth embodiment of the present invention. FIG. 30A is a plane diagram of the wiring structure of this embodiment. FIG. 30B is a cross-sectional diagram of the wiring structure of this embodiment. It should be noted that a two-dotted chain line III—III in FIG. 30A is a line showing the cross section in FIG. 30B. A portion within a one-dotted chain line in FIG. 30A corresponds to an upper layer wiring pattern 801, and a portion within a broken line corresponds to a lower layer wiring pattern 806.

A via pattern 802 and the upper layer wiring pattern 801 are formed by the single damascene method as shown in FIG. 30B in such a manner that side faces of the via pattern 802 and the upper layer wiring pattern 801 vertically align with each other, and the via pattern 802 is included in the upper layer wiring pattern 801. Therefore, according to this embodiment, the top face of the via pattern 802 can be covered with a barrier metal film 805 such as a Ta film or the like having high adhesiveness with the Ta film, the Cu film, and the like for improved moisture-proofness.

Eleventh Embodiment

Figure 31A:
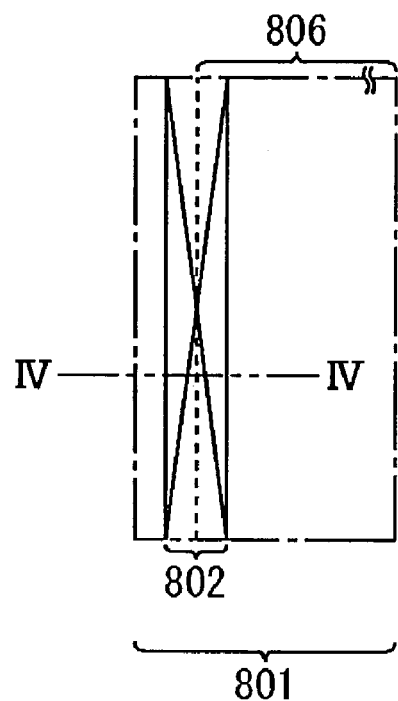
FIGS. 31A and 31B are views showing a wiring structure in an eleventh embodiment of the present invention.
Figure 31B:
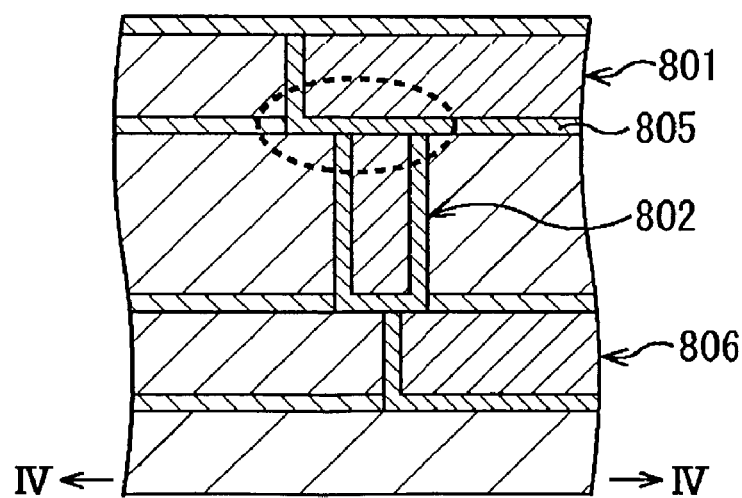

FIGS. 31A and 31B are views showing a wiring structure in an eleventh embodiment of the present invention. FIG. 31A is a plane diagram of the wiring structure of this embodiment. FIG. 31B is a cross-sectional diagram of the wiring structure of this embodiment. It should be noted that a two-dotted chain line IV—IV in FIG. 31A is a line showing the cross section in FIG. 31B. A portion within a one-dotted chain line in FIG. 31A corresponds to an upper layer wiring pattern 801, and a portion within a broken line corresponds to a lower layer wiring pattern 806.

In the wiring structure of this embodiment, a via pattern 802 and the upper layer wiring pattern 801 are formed by the single damascene method as shown in FIG. 31B in such a configuration that the upper layer wiring pattern 801 is formed at a position offset from the via pattern 802. As for the offset direction of the upper layer wiring pattern 801, the upper layer wiring pattern 801 can be formed offset, when necessary, in an arbitrary direction with respect to the via pattern 802 similarly to the previously described relation between the lower layer wiring pattern 806 and the via pattern 802. Therefore, according to this embodiment, the top face of the via pattern 802 can be covered with a barrier metal film 805 such as a Ta film or the like having high adhesiveness with the Ta film, the Cu film, and the like for improved moisture-proofness.

In the above embodiments, a silicon oxide film 123 is used as an interlayer insulation film, and a silicon nitride film 113 is used as an etching stopper film. The interlayer insulation film and the etching stopper film are not limited to them. It is adoptable to use for them, for example, a silicon oxide film ($SiO_2$), a silicon nitride film (SiN), a silicon oxynitride film (SiON), an organosilicate glass film (SiOC), a silicon carbide film (SiC), a silicon carbonitride film (SiCN), and a fluorinated silicon oxide film (SiOF). In this case, however, considering that the etching stopper film needs to be harder in quality to etching than the interlayer insulation film, it is preferable to use as the interlayer insulation film a silicon oxide film ($SiO_2$), a fluorinated silicon oxide film (SiOF), a silicon oxynitride film (SiON), an organosilicate glass film (SiOC), an organic SOG film, or the like, for example, when the etching stopper film is made of a silicon nitride film (SiN), a silicon carbide film (SiC), or a silicon carbonitride film (SiCN).

The preferred embodiments of the present invention have been described in detail. The present invention is not limited to those specific embodiments, but may be changed and modified within the scope of the present invention described in the claims.

According to the present invention, the adhesiveness between the upper end portion of a first barrier metal film and an upper layer is enhanced to enable prevention of entry of moisture or the like at a connecting portion, as a boundary, between the upper end portion of the first barrier metal film and the barrier metal bottom face portion. This can solve problems that a first conductor pattern formed inside the first barrier metal film is corroded and the like, thus improving the reliability of the semiconductor device.

What is claimed is:

1. A semiconductor device, comprising:
   a semiconductor substrate; and
   a moisture-proof ring structure including a first interlayer insulation film formed above said semiconductor substrate; a first conductor pattern formed in said first interlayer insulation film; a first barrier metal film formed between said first interlayer insulation film and said first conductor pattern to cover at least side faces of said first conductor pattern; a second interlayer insulation film formed on said first interlayer insulation film; a second conductor pattern formed above said first conductor pattern with said second interlayer insulation film intervening therebetween; a via contact portion formed in said second interlayer insulation film to connect said first conductor pattern to said second conductor pattern; and a second barrier metal film formed to cover side faces and a bottom face of said via contact portion,
   wherein said moisture-proof ring structure is formed to continuously extend such that a bottom face portion of said second barrier metal film, covering the bottom face of said via contact portion, of said second barrier metal film, is in contact with at least a portion of an upper end portion of said first barrier metal film,
   and wherein a side face of said second barrier metal film is formed at a position offset from a side face of said first barrier metal film to the outside of said semiconductor device.

2. The semiconductor device according to claim 1, wherein said bottom face portion of said second barrier metal film covers at least partially a top face of said first conductor pattern and the upper end portion of said first barrier metal film.

3. The semiconductor device according to claim 2, wherein a portion of said via contact portion enters the inside of said first interlayer insulation film, and a portion or the whole of the side face of said first barrier metal film is covered with the side face of said second barrier metal film corresponding to said entry portion.

4. The semiconductor device according to claim 1, wherein said moisture-proof ring structure further includes a third interlayer insulation film formed on said second interlayer insulation film,
   in said third interlayer insulation film, said second conductor pattern is formed, and a third barrier metal film is formed to cover said faces of said second conductor pattern and a portion or the whole of a bottom face of said second conductor pattern such that a bottom face portion of said third barrier metal film, covering the bottom face of said second conductor pattern, of said third barrier metal film, is in contact with at least a portion of an upper end portion of said second barrier metal film.

5. The semiconductor device according to claim 4, wherein a side face of said second barrier metal film and a side face of said third barrier metal film vertically align with each other.

6. The semiconductor device according to claim 4, wherein said via contact portion is included in said second conductor pattern.

7. The semiconductor device according to claim 4, wherein said via contact portion and said second conductor pattern are formed by a dual damascene method.

8. The semiconductor device according to claim 4, wherein said via contact portion and said second conductor pattern are formed by a single damascene method.

9. The semiconductor device according to claim 8, wherein said bottom face portion of said second barrier metal film covers at least partially a top face of said via contact portion.

10. The semiconductor device according to claim 4, wherein said second conductor pattern is formed in a manner to enter the inside of said second interlayer insulation film.

11. The semiconductor device according to claim 4, wherein a side face of said third barrier metal film is formed at a position offset from a side face of said second barrier metal film to the outside of said semiconductor device.

12. The semiconductor device according to claim 4, wherein said third barrier metal film is composed of the same material as that of said second barrier metal film.

13. The semiconductor device according to claim 12, wherein said second barrier metal film and said third barrier metal film are composed of, as a material, a metal containing at least one of Ta, Ti, Mo, and Zr, or a metallic compound containing at least one of TaN and TiN.

14. The semiconductor device according to claim 4, wherein said first conductor pattern, said via contact portion, and said second conductor pattern are composed of, as a material, Cu or a metal containing Cu.

15. The semiconductor device according to claim 4, wherein said third interlayer insulation film is composed of at least one of a silicon oxide film, a silicon nitride film, a silicon oxynitride film, an organosilicate glass film, a silicon carbide film, a silicon carbonitride film, an organic SOG film, and a fluorinated silicon oxide film.

16. The semiconductor device according to claim 1, wherein said moisture-proof ring structure is mirror-symmetrically formed.

17. The semiconductor device according to claim 1, wherein said moisture-proof ring structure is formed along an outer periphery of a semiconductor circuit region.

18. The semiconductor device according to claim 1, wherein said moisture-proof ring structure is formed in a semiconductor circuit region.

19. The semiconductor device according to claim 18, further comprising:
a fuse element in said semiconductor circuit region,
wherein said moisture-proof ring structure constitutes a portion of said fuse element.

20. The semiconductor device according to claim 19, wherein a side face of said second barrier metal film is formed at a position offset from a side face of said first barrier metal film to a side of a cut portion of said fuse element.

21. The semiconductor device according to claim 19, wherein a side face of said third barrier metal film is formed at a position offset from a side face of said second barrier metal film to a side of a cut portion of said fuse element.

22. The semiconductor device according to claim 1, wherein said second barrier metal film is composed of the same material as that of said first barrier metal film.

23. The semiconductor device according to claim 22, wherein said first barrier metal film and said second barrier metal film are composed of, as a material, a metal containing at least one of Ta, Ti, Mo, and Zr, or a metallic compound containing at least one of TaN and TiN.

24. The semiconductor device according to claim 1, wherein said first conductor pattern and said via contact portion are composed of, as a material, Cu or a metal containing Cu.

25. The semiconductor device according to claim 1, wherein said first interlayer insulation film is composed of at least one of a silicon oxide film, a silicon nitride film, a silicon oxynitride film, an organosilicate glass film, a silicon carbide film, a silicon carbonitride film, an organic SOG film, and a fluorinated silicon oxide film.

26. The semiconductor device according to claim 1, wherein said second interlayer insulation film is composed of at least one of a silicon oxide film, a silicon nitride film, a silicon oxynitride film, an organosilicate glass film, a silicon carbide film, a silicon carbonitride film, an organic SOG film, and a fluorinated silicon oxide film.

* * * * *